(12) United States Patent
Yamazaki et al.

(10) Patent No.: US 9,006,959 B2
(45) Date of Patent: Apr. 14, 2015

(54) LEAD-FREE PIEZOELECTRIC CERAMIC COMPOSITION, PIEZOELECTRIC ELEMENT COMPRISING SAME, KNOCK SENSOR, AND PROCESS FOR PRODUCTION OF LEAD-FREE PIEZOELECTRIC CERAMIC COMPOSITION

(75) Inventors: Masato Yamazaki, Komaki (JP); Takayuki Matsuoka, Nishikasugai-gun (JP); Katsuya Yamagiwa, Komaki (JP); Kazushige Ohbayashi, Nagoya (JP)

(73) Assignee: NGK Spark Plug Co., Ltd., Aichi (JP)

( * ) Notice: Subject to any disclaimer, the term of this patent is extended or adjusted under 35 U.S.C. 154(b) by 8 days.

(21) Appl. No.: 13/392,030

(22) PCT Filed: Jan. 14, 2011

(86) PCT No.: PCT/JP2011/000176
§ 371 (c)(1),
(2), (4) Date: Feb. 23, 2012

(87) PCT Pub. No.: WO2011/093021
PCT Pub. Date: Aug. 4, 2011

(65) Prior Publication Data
US 2012/0146462 A1    Jun. 14, 2012

(30) Foreign Application Priority Data
Jan. 29, 2010   (JP) .................................. 2010-017720

(51) Int. Cl.
H01L 41/187    (2006.01)
H01L 41/43     (2013.01)
(Continued)

(52) U.S. Cl.
CPC .............. *H01L 41/43* (2013.01); *C04B 35/462* (2013.01); *C04B 35/495* (2013.01);
(Continued)

(58) Field of Classification Search
USPC ........ 310/358; 252/62.9 PZ, 36.9 R; 501/134
See application file for complete search history.

(56) References Cited

U.S. PATENT DOCUMENTS 6,387,295 B1    5/2002   Saito
6,579,468 B2    6/2003   Kimura et al.
(Continued)

FOREIGN PATENT DOCUMENTS

JP    2000-313664 A    11/2000
JP    2001-240471 A     9/2001
(Continued)

OTHER PUBLICATIONS

Borisevich, Albina Y., et al., "Analysis of phase distributions in the Li2O—Nb2O5—TiO2 system by piezoresponse imaging", The Journal of Materials Research, Feb. 2001, pp. 329-332, vol. 16, No. 2.
(Continued)

Primary Examiner — Thomas Dougherty
Assistant Examiner — Karen B Addison
(74) Attorney, Agent, or Firm — Sughrue Mion, PLLC

(57) ABSTRACT

A lead-free piezoelectric ceramic composition includes a first crystal phase of alkali niobate/tantalate type perovskite oxide having piezoelectric properties and a second crystal phase of A-Ti—B—O composite oxide (where the element A is an alkali metal; the element B is at least one of Nb and Ta; and the contents of the element A, the element B and Ti are not zero). Examples of the second crystal phase are those represented by $A_{1-x}Ti_{1-x}B_{1+x}O_5$, and x preferably satisfies $0 \leq x \leq 0.15$.

16 Claims, 14 Drawing Sheets

(51) Int. Cl.
 C04B 35/462 (2006.01)
 C04B 35/495 (2006.01)
 G01L 23/22 (2006.01)
(52) U.S. Cl.
 CPC ............ C04B 2235/3201 (2013.01); C04B 2235/3203 (2013.01); C04B 2235/3206 (2013.01); C04B 2235/3208 (2013.01); C04B 2235/3213 (2013.01); C04B 2235/3215 (2013.01); C04B 2235/3224 (2013.01); C04B 2235/3232 (2013.01); C04B 2235/3234 (2013.01); C04B 2235/3241 (2013.01); C04B 2235/3244 (2013.01); C04B 2235/3251 (2013.01); C04B 2235/3255 (2013.01); C04B 2235/3267 (2013.01); C04B 2235/3272 (2013.01); C04B 2235/3279 (2013.01); C04B 2235/3281 (2013.01); C04B 2235/3284 (2013.01); C04B 2235/3291 (2013.01); C04B 2235/3298 (2013.01); G01L 23/222 (2013.01); H01L 41/1873 (2013.01)

(56) References Cited

U.S. PATENT DOCUMENTS

| | | | |
|---|---|---|---|
| 7,267,783 B2 | 9/2007 | Nonoyama et al. | |
| 7,691,286 B2* | 4/2010 | Kawada et al. | 252/62.9 R |
| 2003/0071240 A1* | 4/2003 | Kimura et al. | 252/62.9 R |
| 2009/0236556 A1* | 9/2009 | Tanaka et al. | 252/62.9 R |
| 2010/0022381 A1* | 1/2010 | Tanaka et al. | 501/134 |

FOREIGN PATENT DOCUMENTS

| | | |
|---|---|---|
| JP | 2003-342069 A | 12/2003 |
| JP | 2004-002051 A | 1/2004 |
| TW | 1228728 | 2/1993 |

OTHER PUBLICATIONS

International Search Report of PCT/JP2011/000176, dated Apr. 26, 2011.
Rebbah, Houria, et al., "Nonstoichiometric Oxides with a Layer Structure: The Compounds A1-x(Ti1-xM1+x)O5", Journal of Solid State Chemistry, 1980, pp. 321-328, vol. 31.
Extended European Search Report dated Sep. 2, 2013 for corresponding European Patent Application No. 11736738.3.
Office Action for Japanese Patent Application No. 2011-523249 issued Sep. 26, 2013.
Ahn et al., "Structural variation and piezoelectric properties of $0.95(Na_{0.5}K_{0.5})NbO_3$—$0.05BaTiO_3$ ceramics", Science Direct (Sensors and Actuators A), 136:255-260 (2007).
Office Action for Taiwanese Application No. 100102416 dated Oct. 3, 2013.

* cited by examiner

FIG. 4

| Sample | First crystal phase (main phase) | | | | | | | | | Second crystal phase (secondary phase) | | | Content of secondary phase (mol%) | Relative dielectric constant $\varepsilon_{33}^T/\varepsilon_0$ | Piezoelectric constant $d_{33}$ (pC/N) | Electro-mechanical coupling factor kr |
|---|---|---|---|---|---|---|---|---|---|---|---|---|---|---|---|---|
| | Element C | Element B | $a$ | $b$ | $c$ | $d$ | $e$ | $f$ | | Element A | Element B | $x$ | | | | |
| S01 | — | — | — | — | — | — | — | — | | K | Nb | 0 | 100 | 500 | — | — |
| S02 | — | — | — | — | — | — | — | — | | K | Nb | 0.15 | 100 | 500 | — | — |
| S03 | — | Nb | 0.500 | 0.500 | 0 | 0 | 1.00 | 3.00 | | — | — | — | 0 | 430 | 90 | 0.30 |
| S04 | — | Nb | 0.490 | 0.490 | 0.020 | 0 | 1.00 | 3.00 | | — | — | — | 0 | 430 | 95 | 0.31 |
| S05 | — | Nb | 0.490 | 0.490 | 0.020 | 0 | 1.00 | 3.00 | | K | Nb | 0 | 5 | 1080 | 154 | 0.36 |
| S06 | Ca | Nb | 0.421 | 0.518 | 0.022 | 0.039 | 1.07 | 3.06 | | K | Nb | 0.15 | 3 | 1100 | 120 | 0.30 |
| S07 | Ca | Nb | 0.421 | 0.518 | 0.022 | 0.039 | 1.07 | 3.06 | | K | Nb | 0.15 | 4 | 1110 | 164 | 0.32 |
| S08 | Ca | Nb | 0.421 | 0.518 | 0.022 | 0.039 | 1.07 | 3.06 | | K | Nb | 0.15 | 5 | 1130 | 170 | 0.43 |
| S09 | Ca | Nb | 0.421 | 0.518 | 0.022 | 0.039 | 1.07 | 3.06 | | K | Nb | 0.15 | 6 | 1050 | 163 | 0.35 |
| S10 | Ca | Nb | 0.421 | 0.518 | 0.022 | 0.039 | 1.07 | 3.06 | | K | Nb | 0.15 | 10 | 1000 | 120 | 0.31 |
| S11 | Ca | Nb | 0.421 | 0.518 | 0.022 | 0.039 | 1.07 | 3.06 | | K | Nb | 0.15 | 15 | 950 | 105 | 0.30 |
| S12 | Ca | Nb | 0.421 | 0.518 | 0.022 | 0.039 | 1.07 | 3.06 | | K | Nb | 0.15 | 20 | 900 | 60 | 0.20 |
| S13 | Ca | Nb | 0.455 | 0.474 | 0.022 | 0.049 | 1.07 | 3.06 | | K | Ta | 0 | 5 | 1250 | 153 | 0.35 |
| S14 | Ca | Nb | 0.455 | 0.474 | 0.022 | 0.049 | 1.07 | 3.06 | | K | Nb | 0.15 | 5 | 1200 | 155 | 0.38 |
| S15 | Ca, Sr | Nb | 0.420 | 0.519 | 0.022 | 0.039 | 1.07 | 3.06 | | K | Nb | 0 | 5 | 920 | 120 | 0.31 |

First crystal phase (main phase): $(K_aNa_bLi_cC_d)_eDO_f$
(C: at least one of Ca, Sr and Ba, D: at least one of Nb and Ta, $a+b+c+d=1$, $e$: an arbitrary value, $f$: an arbitrary value that constitutes a perovskite structure)
Second crystal phase (secondary phase): $A_{1-x}Ti_{1-x}B_{1+x}O_5$
(A: at least one kind of alkali metal, B: at least one of Nb and Ta, $x$: an arbitrary value)

FIG. 6

| Sample | First crystal phase (main phase) | | | | | | | | Second crystal phase (secondary phase) | | | Content of secondary phase (mol%) | Curie point Tc (°C) | Room-temperature phase transition |
|---|---|---|---|---|---|---|---|---|---|---|---|---|---|---|
| | Element C | Element B | $a$ | $b$ | $c$ | $d$ | $e$ | $f$ | Element A | Element B | $x$ | | | |
| S01 | — | — | — | — | — | — | — | — | K | Nb | 0 | 100 | — | — |
| S02 | — | — | 0.500 | 0.500 | — | — | — | — | K | Nb | 0.15 | 100 | — | — |
| S03 | — | Nb | 0.490 | 0.490 | 0.020 | 0 | 1.00 | 3.00 | — | — | — | 0 | 400 | occurred |
| S04 | — | Nb | 0.490 | 0.490 | 0.020 | 0 | 1.00 | 3.00 | — | — | — | 0 | 410 | occurred |
| S05 | — | Nb | 0.490 | 0.490 | 0.020 | 0 | 1.00 | 3.00 | K | Nb | 0 | 5 | 340 | not occurred |
| S06 | Ca | Nb | 0.421 | 0.518 | 0.022 | 0.039 | 1.07 | 3.06 | K | Nb | 0.15 | 3 | 350 | not occurred |
| S07 | Ca | Nb | 0.421 | 0.518 | 0.022 | 0.039 | 1.07 | 3.06 | K | Nb | 0.15 | 4 | 350 | not occurred |
| S08 | Ca | Nb | 0.421 | 0.518 | 0.022 | 0.039 | 1.07 | 3.06 | K | Nb | 0.15 | 5 | 350 | not occurred |
| S09 | Ca | Nb | 0.421 | 0.518 | 0.022 | 0.039 | 1.07 | 3.06 | K | Nb | 0.15 | 6 | 350 | not occurred |
| S10 | Ca | Nb | 0.421 | 0.518 | 0.022 | 0.039 | 1.07 | 3.06 | K | Nb | 0.15 | 10 | 350 | not occurred |
| S11 | Ca | Nb | 0.421 | 0.518 | 0.022 | 0.039 | 1.07 | 3.06 | K | Nb | 0.15 | 15 | 350 | not occurred |
| S12 | Ca | Nb | 0.421 | 0.518 | 0.022 | 0.039 | 1.07 | 3.06 | K | Nb | 0.15 | 20 | 350 | not occurred |
| S13 | Ca | Nb | 0.455 | 0.474 | 0.022 | 0.049 | 1.07 | 3.06 | K | Ta | 0 | 5 | 300 | not occurred |
| S14 | Ca | Nb | 0.455 | 0.474 | 0.022 | 0.049 | 1.07 | 3.06 | K | Nb | 0.15 | 5 | 350 | not occurred |
| S15 | Ca, Sr | Nb | 0.420 | 0.519 | 0.022 | 0.039 | 1.07 | 3.06 | K | Nb | 0 | 5 | 340 | not occurred |

First crystal phase (main phase): $(K_aNa_bLi_cC_d)_eDO_f$.
(C: at least one of Ca, Sr and Ba, D: at least one of Nb and Ta, $a+b+c+d=1$, $e$: an arbitrary value, $f$: an arbitrary value that constitutes a perovskite structure)
Second crystal phase (secondary phase): $A_{1-x}Ti_{1-x}B_{1+x}O_5$
(A: at least one kind of alkali metal, B: at least one of Nb and Ta, $x$: an arbitrary value)

FIG. 7

| Sample | First crystal phase (main phase) | | | | | | Second crystal phase (secondary phase) | | | Content of secondary phase (mol%) | Relative dielectric constant $\varepsilon_{33}^T/\varepsilon_0$ | Piezoelectric constant $d_{33}$ (pC/N) | Electro-mechanical coupling factor kr |
|---|---|---|---|---|---|---|---|---|---|---|---|---|---|
| | a | b | c | d | e | f | Element A | Element B | x | | | | |
| S04 | 0.490 | 0.490 | 0.020 | 0 | 1.00 | 3.00 | — | — | — | 0 | 430 | 95 | 0.31 |
| S21 | 0.455 | 0.474 | 0.022 | 0.049 | 0.970 | 3.01 | K | Nb | 0 | 5 | 880 | 105 | 0.29 |
| S22 | 0.455 | 0.474 | 0.022 | 0.049 | 1.000 | 3.02 | K | Nb | 0.15 | 5 | 1040 | 139 | 0.36 |
| S23 | 0.455 | 0.474 | 0.022 | 0.049 | 1.035 | 3.04 | K | Nb | 0.15 | 5 | 1110 | 157 | 0.40 |
| S24 | 0.455 | 0.474 | 0.022 | 0.049 | 1.049 | 3.05 | K | Nb | 0.15 | 5 | 1060 | 167 | 0.42 |
| S25 (S14) | 0.455 | 0.474 | 0.022 | 0.049 | 1.070 | 3.06 | K | Nb | 0.15 | 5 | 1200 | 155 | 0.38 |
| S26 | 0.455 | 0.474 | 0.022 | 0.049 | 1.089 | 3.07 | K | Nb | 0.15 | 5 | 1100 | 47 | 0.12 |
| S27 | 0.455 | 0.474 | 0.022 | 0.049 | 1.100 | 3.08 | K | Nb | 0.15 | 5 | 1090 | 45 | 0.12 |

First crystal phase (main phase): $(K_a Na_b Li_c Ca_d)_e NbO_f$
($a+b+c+d = 1$, $e$: an arbitrary value, $f$: an arbitrary value that constitutes a perovskite structure)
Second crystal phase (secondary phase): $A_{1-x}Ti_{1-x}B_{1+x}O_5$
(A: at least one kind of alkali metal, B: at least one of Nb and Ta, $x$: an arbitrary value)

FIG. 9

| Sample | First crystal phase (main phase) | | | | | | Second crystal phase (secondary phase) | | | Content of secondary phase (mol%) | Additive metal | | Relative dielectric constant $\varepsilon_{33}^T/\varepsilon_0$ | Piezoelectric constant $d_{33}$ (pC/N) | Electro-mechanical coupling factor kr |
|---|---|---|---|---|---|---|---|---|---|---|---|---|---|---|---|
| | $a$ | $b$ | $c$ | $d$ | $e$ | $f$ | Element A | Element B | $x$ | | Metal | mol% | | | |
| S04 | 0.490 | 0.490 | 0.020 | 0 | 1.00 | 3.00 | — | — | — | 0 | — | 0 | 430 | 95 | 0.31 |
| S31 | 0.500 | 0.500 | 0 | 0 | 1.000 | 3.00 | — | — | — | 0 | Cu | 1 | 235 | 95 | 0.37 |
| S32 (S08) | 0.421 | 0.518 | 0.022 | 0.039 | 1.070 | 3.06 | K | Nb | 0.15 | 5 | — | 0 | 1130 | 170 | 0.43 |
| S33 | 0.455 | 0.484 | 0.022 | 0.039 | 1.070 | 3.06 | K | Nb | 0.15 | 5 | Cu | 0.5 | 1050 | 186 | 0.46 |
| S34 | 0.455 | 0.484 | 0.022 | 0.039 | 1.070 | 3.06 | K | Nb | 0.15 | 5 | Cu | 1 | 985 | 138 | 0.38 |
| S35 | 0.455 | 0.484 | 0.022 | 0.039 | 1.070 | 3.06 | K | Nb | 0.15 | 5 | Cu / Fe | 0.5 / 0.5 | 1042 | 200 | 0.48 |
| S36 | 0.464 | 0.474 | 0.022 | 0.039 | 1.070 | 3.06 | K | Nb | 0.15 | 5 | Fe | 0.5 | 1119 | 199 | 0.48 |
| S37 | 0.464 | 0.474 | 0.022 | 0.039 | 1.070 | 3.06 | K | Nb | 0.15 | 5 | Cu / Ni | 0.5 / 0.5 | 1150 | 170 | 0.44 |
| S38 | 0.464 | 0.474 | 0.022 | 0.039 | 1.070 | 3.06 | K | Nb | 0.15 | 5 | Ag | 0.5 | 1060 | 171 | 0.42 |
| S39 | 0.464 | 0.474 | 0.022 | 0.039 | 1.070 | 3.06 | K | Nb | 0.15 | 5 | Zr | 0.5 | 1121 | 166 | 0.42 |
| S40 | 0.464 | 0.474 | 0.022 | 0.039 | 1.070 | 3.06 | K | Nb | 0.15 | 5 | Zn | 0.5 | 1221 | 175 | 0.42 |
| S41 | 0.464 | 0.474 | 0.022 | 0.039 | 1.070 | 3.06 | K | Nb | 0.15 | 5 | Sc / Bi | 0.5 / 0.5 | 1213 | 172 | 0.41 |
| S42 | 0.464 | 0.474 | 0.022 | 0.039 | 1.070 | 3.06 | K | Nb | 0.15 | 5 | Mn | 0.5 | 976 | 156 | 0.42 |
| S43 | 0.455 | 0.474 | 0.022 | 0.049 | 1.070 | 3.06 | K | Nb | 0.15 | 5 | Co | 0.5 | 1080 | 180 | 0.45 |

First crystal phase (main phase): $(K_a Na_b Li_c Ca_d)_e NbO_f$
($a+b+c+d=1$, $e$: an arbitrary value, $f$: an arbitrary value that constitutes a perovskite structure)
Second crystal phase (secondary phase): $A_{1-x} Ti_{1-x} B_{1+x} O_5$
(A: at least one kind of alkali metal, B: at least one of Nb and Ta, $x$: an arbitrary value)

FIG. 10

| Sample | First crystal phase (main phase) | | | | | | Second crystal phase (secondary phase) | | | Content of secondary phase (mol%) | Additive metal | | Applicable voltage cf.) (kV/mm) |
|---|---|---|---|---|---|---|---|---|---|---|---|---|---|
| | $a$ | $b$ | $c$ | $d$ | $e$ | $f$ | Element A | Element B | $x$ | | Metal | mol% | |
| S03 | 0.500 | 0.500 | 0 | 0 | 1.00 | 3.00 | — | — | — | 0 | — | 0 | 3 |
| S04 | 0.490 | 0.490 | 0.020 | 0 | 1.00 | 3.00 | — | — | — | 0 | — | 0 | 3 |
| S08 | 0.421 | 0.518 | 0.022 | 0.039 | 1.070 | 3.06 | K | Nb | 0.15 | 5 | — | 0 | 7 |
| S35 | 0.455 | 0.484 | 0.022 | 0.039 | 1.070 | 3.06 | K | Nb | 0.15 | 5 | Cu, Fe | 0.5, 0.5 | 9 |

First crystal phase (main phase): $(K_aNa_bLi_cCa_d)_eNbO_f$
($a+b+c+d = 1$, $e$: an arbitrary value, $f$: an arbitrary value that constitutes a perovskite structure)
Second crystal phase (secondary phase): $A_{1-x}Ti_{1-x}B_{1+x}O_5$
(A: at least one kind of alkali metal, B: at least one of Nb and Ta, $x$: an arbitrary value)

cf.) Measurement conditions: 80°C, 30 min.

FIG. 11

The case of mixing KTiNbO$_5$ phase as second crystal phase

| Sample | First crystal phase (main phase) | | | | | | Content of secondary phase (mol%) | Additive metal | | NTK phase (XRD) | NTK phase (TEM-EDS) |
|---|---|---|---|---|---|---|---|---|---|---|---|
| | a | b | c | d | e | f | | Metal | mol% | | |
| S06 (FIG. 4) | 0.421 | 0.518 | 0.022 | 0.039 | 1.070 | 3.06 | 3 | — | 0 | — | 1115 |
| S08 (FIG. 4) | 0.421 | 0.518 | 0.022 | 0.039 | 1.070 | 3.06 | 5 | — | 0 | 1115 | 1115 |
| S10 (FIG. 4) | 0.421 | 0.518 | 0.022 | 0.039 | 1.070 | 3.06 | 10 | — | 0 | 1115 | 1115 |
| S12 (FIG. 4) | 0.421 | 0.518 | 0.022 | 0.039 | 1.070 | 3.06 | 20 | — | 0 | 1115 | 1115 |
| S33 (FIG. 9) | 0.455 | 0.484 | 0.022 | 0.039 | 1.070 | 3.06 | 5 | Cu, | 0.5 | — | 1115 |
| S35 (FIG. 9) | 0.455 | 0.484 | 0.022 | 0.039 | 1.070 | 3.06 | 5 | Cu, Fe | 0.5, 0.5 | 1319 | 1319 |
| S36 (FIG. 9) | 0.464 | 0.474 | 0.022 | 0.039 | 1.070 | 3.06 | 5 | Fe | 0.5 | 1319 | 1319 |
| S40 (FIG. 9) | 0.464 | 0.474 | 0.022 | 0.039 | 1.070 | 3.06 | 5 | Zn | 0.5 | 1115 | 1115 |
| S42 (FIG. 9) | 0.464 | 0.474 | 0.022 | 0.039 | 1.070 | 3.06 | 5 | Mn | 0.5 | 1115, 1319 | 1115, 1319 |

First crystal phase (main phase): $(K_aNa_bLi_cCa_d)_eNbO_f$
($a+b+c+d = 1$, $e$: an arbitrary value, $f$: an arbitrary value that constitutes a perovskite structure)
Second crystal phase (secondary phase):
NTK phase: 1115    KTiNbO$_5$ phase
NTK phase: 1319    KT$_3$NbO$_9$ phase

FIG. 12

The case of mixing KTi₃NbO₉ phase as second crystal phase

| Sample | First crystal phase (main phase) | | | | | | Content of secondary phase (mol%) | Additive metal | | NTK phase (XRD) | NTK phase (TEM-EDS) |
|---|---|---|---|---|---|---|---|---|---|---|---|
| | $a$ | $b$ | $c$ | $d$ | $e$ | $f$ | | Metal | mol% | | |
| S51 | 0.421 | 0.518 | 0.022 | 0.039 | 1.070 | 3.06 | 3 | — | 0 | — | 1319 |
| S52 | 0.421 | 0.518 | 0.022 | 0.039 | 1.070 | 3.06 | 5 | — | 0 | 1319 | 1319 |
| S53 | 0.455 | 0.484 | 0.022 | 0.039 | 1.070 | 3.06 | 5 | Cu | 0.5 | — | 1319 |
| S54 | 0.455 | 0.484 | 0.022 | 0.039 | 1.070 | 3.06 | 5 | Cu, Fe | 0.5, 0.5 | 1319 | 1319 |
| S55 | 0.421 | 0.518 | 0.022 | 0.039 | 1.070 | 3.06 | 5 | Fe | 0.5 | 1319 | 1319 |
| S56 | 0.421 | 0.508 | 0.022 | 0.049 | 1.070 | 3.07 | 5 | Zn | 0.5 | 1319 | 1319 |
| S57 | 0.416 | 0.503 | 0.033 | 0.049 | 1.080 | 3.07 | 5 | Mn | 0.5 | 1319 | 1319 |

First crystal phase (main phase): $(K_a Na_b Li_c Ca_d)_e NbO_f$
($a+b+c+d = 1$, $e$: an arbitrary value, $f$: an arbitrary value that constitutes a perovskite structure)
Second crystal phase (secondary phase):
NTK phase: 1115  KTiNbO₅ phase
NTK phase: 1319  KTi₃NbO₉ phase

FIG. 13

| Sample | First crystal phase (main phase) | | | | | | | | | Content of secondary phase (mol%) | Additive metal | | Relative dielectric constant $\varepsilon_{33}^T/\varepsilon_0$ | Piezoelectric constant $d_{33}$ (pC/N) | Electro-mechanical coupling factor kr |
|---|---|---|---|---|---|---|---|---|---|---|---|---|---|---|---|
| | Element C1, C2 | a | b | c | d1 | d2 | e | f | | Metal | mol% | | | |
| S04 (FIG. 9) | Ca | 0.490 | 0.490 | 0.020 | 0 | 0 | 1.00 | 3.00 | 0 | — | 0 | 430 | 95 | 0.31 |
| S31 (FIG. 9) | — | 0.500 | 0.500 | 0.000 | 0 | 0 | 1.00 | 3.00 | 0 | Cu | 1 | 235 | 95 | 0.37 |
| S61 | Ca, Ba | 0.449 | 0.478 | 0.022 | 0.039 | 0.011 | 1.08 | 3.07 | 5 | Zr | 1 | 1207 | 189 | 0.42 |
| S62 | Ca, Ba | 0.449 | 0.478 | 0.022 | 0.039 | 0.011 | 1.08 | 3.07 | 5 | Cu, Zr | 0.5, 1 | 1370 | 224 | 0.50 |
| S63 | Ca, Ba | 0.449 | 0.478 | 0.022 | 0.039 | 0.011 | 1.08 | 3.07 | 5 | Fe, Zr | 0.5, 1 | 1405 | 185 | 0.42 |
| S64 | Ca, Ba | 0.449 | 0.478 | 0.022 | 0.039 | 0.011 | 1.08 | 3.07 | 5 | Zn, Zr | 0.5, 1 | 1414 | 203 | 0.46 |
| S65 | Ca, Ba | 0.449 | 0.478 | 0.022 | 0.039 | 0.011 | 1.08 | 3.07 | 5 | Cu, Fe, Zr | 0.5, 0.5, 1 | 1480 | 234 | 0.52 |
| S66 | Ca, Ba | 0.449 | 0.478 | 0.022 | 0.039 | 0.011 | 1.08 | 3.07 | 5 | Cu, Fe, Zr | 0.6, 0.3, 1 | 1502 | 243 | 0.52 |
| S67 | Ca, Ba | 0.449 | 0.478 | 0.022 | 0.039 | 0.011 | 1.08 | 3.07 | 5 | Fe, Zn, Zr | 0.5, 0.5, 1 | 1445 | 205 | 0.47 |
| S68 | Ca, Ba | 0.449 | 0.478 | 0.022 | 0.039 | 0.011 | 1.08 | 3.07 | 5 | Cu, Fe, Zn, Zr | 0.5, 0.5, 0.5, 1 | 1550 | 253 | 0.51 |
| S69 | Ca | 0.449 | 0.478 | 0.022 | 0.050 | 0 | 1.08 | 3.07 | 5 | Cu, Fe, Zr | 0.5, 0.5, 1 | 1390 | 217 | 0.48 |
| S70 | Ca, Sr | 0.449 | 0.478 | 0.022 | 0.039 | 0.011 | 1.08 | 3.07 | 5 | Cu, Fe, Zr | 0.5, 0.5, 1 | 1278 | 211 | 0.47 |
| S71 | Ca, Ba | 0.396 | 0.532 | 0.022 | 0.039 | 0.011 | 1.08 | 3.07 | 5 | Cu, Fe, Zr | 0.5, 0.5, 1 | 1317 | 205 | 0.46 |
| S72 | Ca | 0.396 | 0.532 | 0.022 | 0.050 | 0 | 1.08 | 3.07 | 5 | Ni, Cu, Zr | 0.5, 0.5, 1 | 1329 | 189 | 0.43 |
| S73 | Ca, Sr | 0.396 | 0.532 | 0.022 | 0.039 | 0.011 | 1.08 | 3.07 | 5 | Ni, Cu, Zr | 0.5, 0.5, 1 | 1285 | 183 | 0.41 |
| S74 | Ca, Ba | 0.449 | 0.478 | 0.022 | 0.039 | 0.012 | 0.98 | 3.01 | 5 | Cu, Fe, Zr | 0.5, 0.5, 1 | 904 | 83 | 0.24 |
| S75 | Ca, Ba | 0.449 | 0.478 | 0.022 | 0.039 | 0.012 | 1.047 | 3.05 | 5 | Cu, Fe, Zr | 0.5, 0.5, 1 | 988 | 121 | 0.33 |
| S76 | Ca | 0.396 | 0.537 | 0.022 | 0.045 | 0 | 1.08 | 3.06 | 5 | Ni, Cu, Zr | 0.5, 0.5, 1 | 1070 | 142 | 0.37 |
| S77 | Ca, Sr | 0.396 | 0.537 | 0.022 | 0.034 | 0.011 | 1.08 | 3.01 | 5 | Ni, Cu, Zr | 0.5, 0.5, 1 | 1300 | 195 | 0.45 |
| S78 | Ca, Ba | 0.449 | 0.478 | 0.022 | 0.039 | 0.011 | 0.98 | 3.07 | 5 | Cu, Fe, Zn, Zr | 0.5, 0.5, 0.5, 1 | 1360 | 174 | 0.39 |
| S79 | Ca, Ba | 0.449 | 0.478 | 0.022 | 0.039 | 0.011 | 1.09 | 3.07 | 5 | Cu, Fe, Zn, Zr | 0.5, 0.5, 0.5, 1 | 1500 | 205 | 0.41 |
| S80 | Ca, Ba | 0.449 | 0.478 | 0.022 | 0.039 | 0.011 | 1.12 | 3.09 | 5 | Cu, Fe, Zn, Zr | 0.5, 0.5, 0.5, 1 | | not closely packed | |
| S81 | Ca, Ba | 0.449 | 0.478 | 0.022 | 0.039 | 0.011 | 1.08 | 3.07 | 0 | — | 0 | | not closely packed | |

First crystal phase (main phase): $(K_aNa_bLi_cC1_{d1}C2_{d2})_eNbO_f$
(C1, C2: at least one of Ca, Sr and Ba, $a+b+c+d1+d2=1$, $e$: an arbitrary value, $f$: an arbitrary value that constitutes a perovskite structure)
Second crystal phase (secondary phase): $K_{0.85}Ti_{0.85}Nb_{1.15}O_5$

FIG. 14

| Sample | First crystal phase (main phase) | | | | | | | Content of secondary phase (mol%) | Additive metal | | Electromechanical coupling factor kr | | Drop rate (%) |
|---|---|---|---|---|---|---|---|---|---|---|---|---|---|
| | Element C1, C2 | a | b | c | d1 | d2 | e | f | | Metal | mol% | Initial value | After thermal cycle | |
| S04 (FIG. 9) | Ca | 0.490 | 0.490 | 0.020 | 0 | 0 | 1.00 | 3.00 | 0 | — | 0 | 0.31 | 0.10 | -67.7 |
| S31 (FIG. 9) | — | 0.500 | 0.500 | 0 | 0 | 0 | 1.00 | 3.00 | 0 | Cu | 1 | 0.37 | 0.12 | -67.6 |
| S32 (FIG. 9) | Ca | 0.421 | 0.518 | 0.022 | 0.039 | 0 | 1.07 | 3.06 | 5 | — | 0 | 0.43 | 0.32 | -25.6 |
| S61 (FIG. 13) | Ca, Ba | 0.449 | 0.478 | 0.022 | 0.039 | 0.011 | 1.08 | 3.07 | 5 | Zr | 1 | 0.42 | 0.32 | -23.8 |
| S62 (FIG. 13) | Ca, Ba | 0.449 | 0.478 | 0.022 | 0.039 | 0.011 | 1.08 | 3.07 | 5 | Cu, Zr | 0.5, 1 | 0.50 | 0.40 | -20.0 |
| S63 (FIG. 13) | Ca, Ba | 0.449 | 0.478 | 0.022 | 0.039 | 0.011 | 1.08 | 3.07 | 5 | Fe, Zr | 0.5, 1 | 0.42 | 0.36 | -14.3 |
| S64 (FIG. 13) | Ca, Ba | 0.449 | 0.478 | 0.022 | 0.039 | 0.011 | 1.08 | 3.07 | 5 | Zn, Zr | 0.5, 1 | 0.46 | 0.34 | -26.1 |
| S65 (FIG. 13) | Ca, Ba | 0.449 | 0.478 | 0.022 | 0.039 | 0.011 | 1.08 | 3.07 | 5 | Cu, Fe, Zr | 0.5, 0.5, 1 | 0.52 | 0.44 | -15.4 |
| S67 (FIG. 13) | Ca, Ba | 0.449 | 0.478 | 0.022 | 0.039 | 0.011 | 1.08 | 3.07 | 5 | Fe, Zn, Zr | 0.5, 0.5, 1 | 0.47 | 0.37 | -21.3 |
| S68 (FIG. 13) | Ca, Ba | 0.449 | 0.478 | 0.022 | 0.039 | 0.011 | 1.08 | 3.07 | 5 | Cu, Fe, Zn, Zr | 0.5, 0.5, 0.5, 1 | 0.51 | 0.45 | -11.8 |
| S69 (FIG. 13) | Ca | 0.449 | 0.478 | 0.022 | 0.050 | 0 | 1.08 | 3.07 | 5 | Cu, Fe, Zr | 0.5, 0.5, 1 | 0.48 | 0.43 | -10.4 |

First crystal phase (main phase): $(K_a Na_b Li_c C1_{d1} C2_{d2})_e NbO_f$
(C1, C2: at least one of Ca, Sr and Ba, $a+b+c+d1+d2 = 1$, $e$: an arbitrary value, $f$: an arbitrary value that constitutes a perovskite structure)
Second crystal phase (secondary phase): $K_{0.85} Ti_{0.85} Nb_{1.15} O_5$ Test method
(1) Place a piezoelectric element in a thermostat and evaluate the piezoelectric properties of the piezoelectric element at room temperature (as the initial properties of the piezoelectric element).
(2) Subject the piezoelectric element to thermal cycle of -50°C, 150°C, 20°C, 150°C and 20°C at a temperature increase/decrease rate of 2°C/min (holding time: 1 hour at each temperature).
(3) Evaluate the piezoelectric properties of the piezoelectric element at room temperature (as the properties of the piezoelectric element after the thermal cycle).

LEAD-FREE PIEZOELECTRIC CERAMIC COMPOSITION, PIEZOELECTRIC ELEMENT COMPRISING SAME, KNOCK SENSOR, AND PROCESS FOR PRODUCTION OF LEAD-FREE PIEZOELECTRIC CERAMIC COMPOSITION

CROSS REFERENCE TO RELATED APPLICATIONS

This application is a National Stage of International Application No. PCT/JP2011/000176 filed Jan. 14, 2011, claiming priority based on Japanese Patent Application No. 2009-017720 filed Jan. 29, 2010, the contents of all of which are incorporated herein by reference in their entirety.

TECHNICAL FIELD

The present invention relates to a lead-free piezoelectric ceramic composition for a piezoelectric device and the like and to a process for production of the lead-free piezoelectric ceramic composition.

BACKGROUND ART

The majority of conventionally mass-produced piezoelectric ceramic compositions are PZT (lead zirconate titanate) materials and thus contain lead. In recent years, the development of lead-free piezoelectric ceramic materials has been desired in order to eliminate the adverse influence of lead on the environment. As such lead-free piezoelectric ceramic materials (called "lead-free piezoelectric ceramic compositions"), there have been proposed those represented by the compositional formula: $ANbO_3$ (where A is an alkali metal) such as potassium sodium niobate ($(K,Na)NbO_3$). However, the lead-free $ANbO_3$ piezoelectric ceramic compositions themselves have the problem of poor sinterability and moisture resistance.

As a measure against this problem, Patent Document 1 discloses a technique of adding Cu, Li, Ta or the like to a lead-free $ANbO_3$ piezoelectric ceramic composition so as to obtain improvements in sinterability and in piezoelectric properties.

Further, Patent Document 2 discloses a lead-free piezoelectric ceramic composition represented by the general formula: $\{Li_x(K_{1-y}Na_y)_{1-x}\}(Nb_{1-z}Sb_z)O_3$ (where $0 \le x \le 0.2$; $0 \le y \le 1.0$; and $0 \le z \le 0.2$ except for the case of $x=z=0$) and capable of showing relatively good sinterability and piezoelectric properties.

PRIOR ART DOCUMENTS

Patent Document

Patent Document 1: Japanese Laid-Open Patent Publication No. 2000-313664
Patent Document 2: Japanese Laid-Open Patent Publication No. 2003-342069

SUMMARY OF THE INVENTION

Problems to be Solved by the Invention

The piezoelectric ceramic composition of Patent Document 1 shows improved sinterability, but has inferior piezoelectric properties to those of the conventional lead-containing piezoelectric ceramic compositions and thus does not attain sufficient practicality. On the other hand, the piezoelectric ceramic composition of Patent Document 2 attains a relatively high piezoelectric constant, but has a phase transition point between −50° C. and +150° C. and thus shows abrupt property changes above and below the phase transition point.

It is an object of the present invention to provide a lead-free piezoelectric ceramic composition having good piezoelectric properties without abrupt property changes in a range of −50° C. to +150° C. It is also an object of the present invention to provide a piezoelectric element using the lead-free piezoelectric ceramic composition and to provide a process for production of the lead-free piezoelectric ceramic composition.

Means for Solving the Problems

The present invention has been made to solve at least part of the above-mentioned problems and can be embodied in the following aspects or application examples.

Application Example 1

A lead-free piezoelectric ceramic composition, comprising:
a first crystal phase of alkali niobate/tantalate type perovskite oxide having piezoelectric properties; and
a second crystal phase of A-Ti—B—O composite oxide (where the element A is an alkali metal; the element B is at least one of Nb and Ta; and the contents of the element A, the element B and Ti are not zero).

It is possible according to this aspect that the lead-free piezoelectric ceramic composition can have better piezoelectric properties than those of a composition consisting only of the first crystal phase and shows no abrupt property changes between −50° C. and +150° C.

Application Example 2

The lead-free piezoelectric ceramic composition according to Application Example 1, wherein the second crystal phase contains at least one of a crystal phase represented by $A_{1-x}Ti_{1-x}B_{1+x}O_5$ and a crystal phase represented by $A_1Ti_3B_1O_9$.

It is possible according to this aspect that the lead-free piezoelectric ceramic composition can have good piezoelectric properties and shows no abrupt property changes between −50° C. and +150° C. as the second crystal phase exhibits good piezoelectric properties.

Application Example 3

The lead-free piezoelectric ceramic composition according to Application Example 2, wherein the second crystal phase is a crystal phase represented by $A_{1-x}Ti_{1-x}B_{1+x}O_5$.

It is possible according to this aspect that the lead-free piezoelectric ceramic composition can have better piezoelectric properties than those of a composition consisting only of the first crystal phase and shows no abrupt property changes between −50° C. and +150° C.

Application Example 4

The lead-free piezoelectric ceramic composition according to Application Example 2, wherein x satisfies $0 \le x \le 0.15$.

It is possible according to this aspect that the lead-free piezoelectric ceramic composition as a whole can have good piezoelectric properties. It is also possible to, as the second crystal phase becomes stable, ensure the stability of the lead-free piezoelectric composition as a whole and improve the insulating properties of the lead-free piezoelectric ceramic composition.

Application Example 5

The lead-free piezoelectric ceramic composition according to Application Example 4, wherein the element A is K.

It is possible according to this aspect that the lead-free piezoelectric ceramic composition can be provided with good piezoelectric properties at low cost.

Application Example 6

The lead-free piezoelectric ceramic composition according to Application Example 4, wherein the element A is Cs; and wherein x satisfies $0 \leq x \leq 0.1$.

It is possible according to this aspect that the lead-free piezoelectric ceramic composition as a whole can have good piezoelectric properties as the second crystal phase becomes more stable. It is also possible to increase the stability of the lead-free piezoelectric ceramic composition as a whole and improve the insulating properties of the lead-free piezoelectric ceramic composition.

Application Example 7

The lead-free piezoelectric ceramic composition according to any one of Application Examples 1 to 6, wherein the element B is Nb.

It is possible according to this aspect that the lead-free piezoelectric ceramic composition can be provided with high heat resistance at low cost and can also have a higher Curie temperature (Tc) than that of the case where the element B is Ta.

Application Example 8

The lead-free piezoelectric ceramic composition according to any one of Application Examples 1 to 7, wherein the content of the second crystal phase in the lead-free piezoelectric ceramic composition is more than 0 mol % and less than or equal to 15 mol %.

It is possible according to this aspect that the lead-free piezoelectric ceramic composition can have a high piezoelectric constant.

Application Example 9

The lead-free piezoelectric ceramic composition according to any one of Application Examples 1 to 8, wherein the alkali niobate/tantalate type perovskite oxide of the first crystal phase contains an alkaline-earth metal.

It is also possible according to this aspect that the lead-free piezoelectric ceramic composition can have good piezoelectric properties.

Application Example 10

The lead-free piezoelectric ceramic composition according to Application Example 9, wherein the alkali niobate/tantalate type perovskite oxide of the first crystal phase is represented by $(K_a Na_b Li_c C_d)_e DO_f$ (where the element C is at least one alkaline-earth metal selected from Ca, Sr and Ba; the element D is at least one of Nb and Ta; a, b, c and d satisfy $a+b+c+d=1$; and e and f are each an arbitrary value).

It is possible that the lead-free piezoelectric ceramic composition with these first and second crystal phases can have good insulating properties and piezoelectric properties.

Application Example 11

The lead-free piezoelectric ceramic composition according to Application Example 10, wherein e satisfies $0.97 \leq e \leq 1.08$.

It is possible according to this aspect that the lead-free piezoelectric ceramic composition can have better piezoelectric properties.

Application Example 12

The lead-free piezoelectric ceramic composition according to any one of Application Examples 1 to 11, further comprising at least one metal element selected from Cu, Ni, Co, Fe, Mn, Cr, Zr, Ag, Zn, Sc and Bi.

It is also possible according to this aspect that the lead-free piezoelectric ceramic composition can have good piezoelectric properties.

Application Example 13

A piezoelectric element, comprising:
a piezoelectric ceramic body formed of the lead-free piezoelectric ceramic composition according to any one of Application Examples 1 to 12; and
electrodes fixed to the piezoelectric ceramic body.

Application Example 14

A knock sensor comprising the piezoelectric element according to Application Example 13.

Application Example 15

An ultrasonic transducer comprising the piezoelectric element according to Application Example 13.

Application Example 16

A cutting tool comprising the piezoelectric element according to Application Example 13.

Application Example 17

A process for production of the lead-free piezoelectric ceramic composition according to any one of Application Examples 1 to 12, comprising:
preparing a first powder by mixing and calcinating raw materials of the first crystal phase;
preparing a second powder by mixing and calcinating raw materials of the second crystal phase; and
forming the lead-free piezoelectric ceramic composition by mixing the first and second powders into a mixed power material, and then, molding and baking the mixed powder material.

In this production process, the first and second crystal phases are formed separately. It is thus possible to control the compositions of the first and second crystal phases more strictly and improve the yield of the lead-free piezoelectric ceramic composition.

BRIEF DESCRIPTION OF DRAWINGS

FIG. 4 is a diagram showing experimental results about the influence of the content of the secondary phase and the like on the properties of the piezoelectric ceramic composition.

FIG. 6 is a diagram showing experimental results about the influence of the content of the secondary phase and the like on the phase transition temperature of the piezoelectric ceramic composition.

FIG. 7 is a diagram showing experimental results about the influence of the factor e of the compositional formula of the main phase on the properties of the piezoelectric ceramic composition.

FIG. 9 is a diagram showing experimental results about the influence of the additive metal on the properties of the piezoelectric ceramic composition.

FIG. 10 is a diagram showing experimental results about the influence of the presence or absence of the secondary phase on the insulating properties of the piezoelectric ceramic composition.

FIG. 11 is a diagram showing analysis results on the second crystal phase of the piezoelectric ceramic composition in the case of mixing a $KTiNbO_5$ phase as the secondary phase.

FIG. 12 is a diagram showing analysis results on the second crystal phase of the piezoelectric ceramic composition in the case of mixing a $KTi_3NBO_9$ phase as the secondary phase.

FIG. 13 is a diagram showing other experimental results about the influence of the additive metal on the properties of the piezoelectric ceramic composition.

FIG. 14 is a diagram showing results of thermal cycle test on the piezoelectric ceramic composition.

BEST MODES FOR CARRYING OUT THE INVENTION

Figure 1:
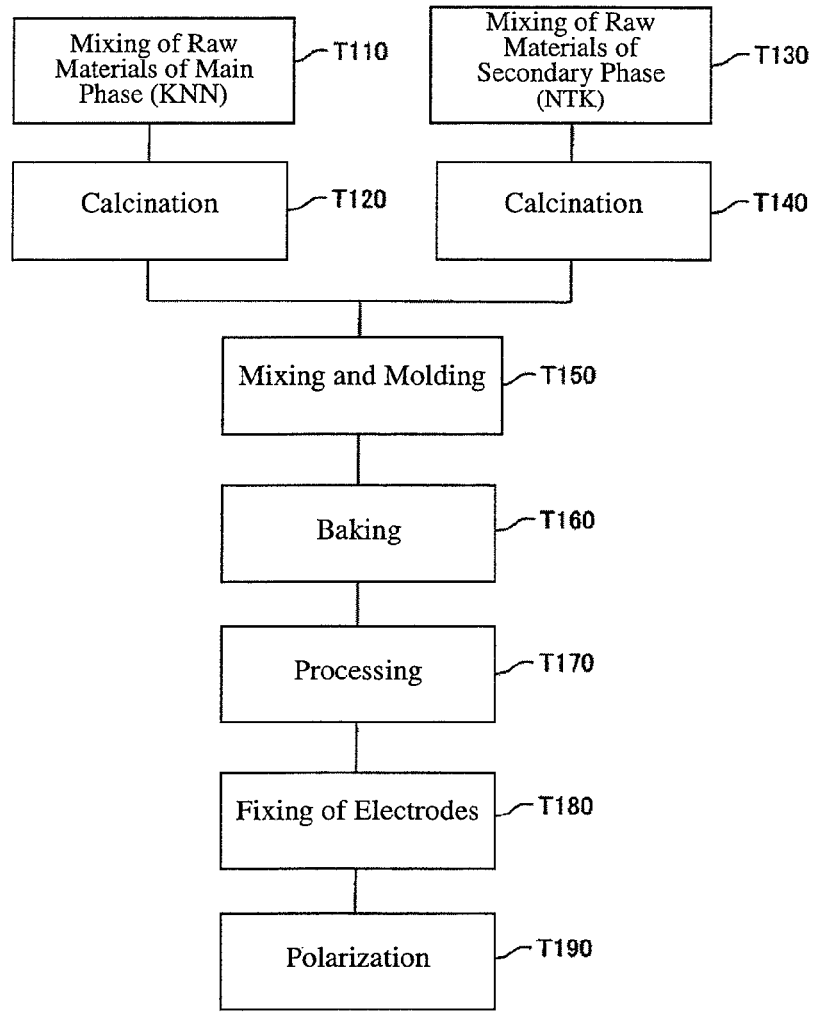
FIG. 1 is a flowchart showing a process for production of a piezoelectric element according to one embodiment of the present invention.

A lead-free piezoelectric ceramic composition according to one embodiment of the present invention includes a first crystal phase of alkali niobate/tantalate type perovskite oxide having piezoelectric properties and a second crystal phase having no piezoelectric properties. In the present embodiment, the lead-free piezoelectric ceramic composition typically contains more than 0 mol % to less than 20 mol % of the second crystal phase and the balance being the first crystal phase. The first crystal phase and the second crystal phase are hereinafter sometimes referred to as "main phase" and "secondary phase", respectively. Typical examples of the lead-free piezoelectric ceramic composition are those in which the second crystal phase is formed of a layered-structure compound (a layered compound). In these examples, the second crystal phase can be mixed with the first crystal phase so as to improve the sinterability and insulating properties of the piezoelectric ceramic composition. Further, the crystal structure of the first crystal phase can be stabilized so as not to cause abrupt property changes due to a phase transition between −50° C. and +150° C.

The perovskite oxide of the first crystal phase is preferably either an alkali niobate perovskite oxide or an alkali tantalate perovskite oxide. The term "alkali niobate/tantalate type perovskite oxide" is a generic name for these two kinds of perovskite oxides. The alkali niobate/tantalate type perovskite oxide contains, as an alkali element, at least an alkali metal (such as Li, Na and K) and optionally an alkaline-earth metal (such as Ca (calcium), Sr (strontium) and Ba (barium)). As the alkali niobate/tantalate type perovskite oxide, preferred are those represented by the following compositional formula.

[Compositional Formula of Preferred First Crystal Phase]

$(K_aNa_bLi_cC_d)_eDO_f$

Herein, the element C is at least one alkaline-earth metal selected from Ca (calcium), Sr (strontium) and Ba (barium); the element D is at least one of Nb (niobium) and Ta (tantalum); a, b, c and d satisfy a+b+c+d=1; and e andf are each an arbitrary value.

In the above compositional formula, the A-site of the perovskite structure is occupied by K (potassium), Na (sodium), Li (lithium) and the element C (Ca, Sr, Ba); and the B-site of the perovskite structure is occupied by the element D (Nb, Ta). Namely, the alkali niobate/tantalate type perovskite oxide has one or more alkali metals (K, Na, Li) and optionally the alkaline-earth metal (Ca, Sr, Ba) at the A-site and one or more of Nb (niobium) and Ta (tantalum) at the B-site.

The factors a to f are preferably selected, in view of the electrical or piezoelectric properties (notably, piezoelectric constant $d_{33}$) of the lead-free piezoelectric ceramic composition, from various possible combinations of values that the perovskite structure can be formed. More specifically, the factors a, b, c and d satisfy 0≤a≤1, 0≤b≤1, 0≤c≤1 and 0≤d≤1, respectively, except for the case of a=b=c=0 (i.e. the case where the perovskite oxide contains none of K (potassium), Na (sodium) and Li (lithium)). The factor a for K (potassium) and the factor b for Na (sodium) typically satisfy 0<a≤0.6 and 0≤b≤0.6. The factor c for Li (lithium) may be zero but preferably satisfies 0<c≤0.2, more preferably 0<c≤0.1. The factor d for the element C (Ca, Sr, Ba) may also be zero but preferably satisfies 0<d≤0.1, more preferably 0<d≤0.05. Further, the factor e for the entire A-site takes any arbitrary value but typically satisfies 0.9≤e≤1.1, preferably 0.97≤e≤1.08, more preferably 1.00≤e≤1.08.

In the above compositional formula, the valence of K, Na and Li are each +1; the valence of the element C (Ca, Sr, Ba) is +2; the valence of the element D (Nb, Ta) is +5; and the valence of O (oxygen) is +2. The factor f takes any arbitrary value that the perovskite oxide can be constituted by the first crystal phase. Typically, the factor f is about 3. The factors a to f can be expressed by the following formula (1) based on the electrical neutralization conditions of the composition.

$$(a+b+c+2 \cdot d) \cdot e + 5 \approx 2 \cdot f \qquad (1)$$

A typical example of the composition of the first crystal phase is $(K, Na, Li, Ca)_{1.07}NbO_{3.06}$ (where the factors a to d are omitted). In this case, the first crystal phase contains K (potassium), Na (sodium) and Nb (niobium) as its main metal components. The material formed of such a first crystal phase is also called "KNN" or "KNN material". The piezoelectric ceramic composition can be provided with good piezoelectric properties at low cost by selection of Ca (calcium) as the element C and Nb (niobium) as the element D as indicated above.

As the second crystal phase, preferred are those represented by the following compositional formula.

[Compositional Formula of Preferred Second Crystal Phase]

$$A_{1-x}Ti_{1-x}B_{1+x}O_5$$

Herein, the element A is at least one alkali metal selected from K (potassium), Rb (rubidium) and Cs (cesium); the element B is at least one of Nb (niobium) and Ta (tantalum); and x is an arbitrary value. Preferably, the factor x satisfies $0 \leq x \leq 0.15$. When the factor x falls within such a range, the second crystal phase can attain a stable and uniform structure.

Specific examples of the second crystal phase represented by the above compositional formula are $KTiNbO_5$, $K_{0.90}Ti_{0.90}Nb_{1.10}O_5$, $K_{0.85}Ti_{0.85}Nb_{1.15}O_5$, $RbTiNbO_5$, $Rb_{0.90}Ti_{0.90}Nb_{1.10}O_5$, $Rb_{0.85}Ti_{0.85}Nb_{1.15}O_5$, $CsTiNbO_5$, $Cs_{0.90}Ti_{0.90}Nb_{1.10}O_5$, $KTiTaO_5$ and $CsTiTaO_5$. In view of the structural stability of the second crystal phase, it is preferable that the factor x satisfies $0 \leq x \leq 0.15$ in the case where the element A is K (potassium) or Rb (rubidium) and satisfies $0 \leq x \leq 0.10$ in the case where the element A is Cs (cesium). The piezoelectric ceramic composition can be provided with good properties at low cost by selection of K (potassium) as the element A and Nb (niobium) as the element B.

Although the second crystal phase does not exhibit piezoelectric properties, the coexistence of the second crystal phase with the first crystal phase leads to improvements in the sinterability and, in addition, insulating properties of the piezoelectric ceramic composition and contributes to the effect that the piezoelectric ceramic composition does not show a phase transition point between −50° C. and +150° C. The reason for the effect that the piezoelectric ceramic composition can attain improved insulating properties and shows no phase transition point in the above range are assumed that second crystal phase is of layered-structure compound (layered compound). Herein, it has been reported that the second crystal phase has a stable structure by H. Rebbah et al., Journal of Solid State Chemistry, Vol. 31, P. 321-328, 1980, which is hereby wholly incorporated by reference.

The content of the second crystal phase in the composition is more than 0 mol % and less than 20 mol %, preferably more than 0 mol % and less than or equal to 15 mol %. There is a tendency that the composition shows abrupt property changes between −50° C. and +150° C. if the composition has no second crystal phase (i.e. the composition consists only of the first crystal phase). If the content of the second crystal phase exceeds 15 mol %, there is a possibility that the piezoelectric properties (notably, piezoelectric constant $d_{33}$) of the composition may be deteriorated.

A typical example of the composition of the second crystal phase is $K_{0.85}Ti_{0.85}Nb_{1.15}O_5$. In this case, the second crystal phase contains Nb (niobium), Ti (titanium) and K (potassium) as its main metal components. The material formed of such a second crystal phase is also called "NTK" or "NTK material".

As the second crystal phase, there are also preferred those represented by $A_1Ti_3B_1O_9$ in addition to those represented by $A_{1-x}Ti_{1-x}B_{1+x}O_5$. In the present specification, the factor "1" may be systematically indicated for the purpose of clarifying the difference in crystal phase between $A_1Ti_3B_1O_9$ and $A_{1-x}Ti_{1-x}B_{1+x}O_5$ although it is common practice to omit the factor "1" from the compositional formula. Hereinafter, the crystal phase represented by $A_{1-x}Ti_{1-x}B_{1+x}O_5$ may be referred to as "NTK1115 phase" or simply "1115 phase"; and the crystal phase represented by $A_1Ti_3B_1O_9$ may be referred to as "NTK1319 phase" or simply "1319 phase".

In the compositional formula: $A_1Ti_3B_1O_9$, the element A is at least one alkali metal (K (potassium), Rb (rubidium) or Cs (cesium); the element B is at least one of Nb (niobium) and Ta (tantalum). Although the second crystal phase represented by $A_1Ti_3B_1O_9$ does not also exhibit piezoelectric properties, the coexistence of such a second crystal phase with the first crystal phase leads to improvements in the sinterability and, in addition, insulating properties of the piezoelectric ceramic composition and contributes to the effect that the piezoelectric ceramic composition does not show a phase transition point between −50° C. and +150° C.

When the second crystal phase is represented by $A_1Ti_3B_1O_9$, the content of the second crystal phase in the composition is also more than 0 mol % and less than 20 mol %, preferably more than 0 mol % and less than or equal to 15 mol %. There is a tendency that the composition shows abrupt property changes between −50° C. and +150° C. if the composition has no second crystal phase (i.e. the composition consists only of the first crystal phase). If the content of the second crystal phase exceeds 15 mol %, there is a possibility that the piezoelectric properties (notably, piezoelectric constant $d_{33}$) of the composition may be deteriorated.

The $A_{1-x}Ti_{1-x}B_{1+x}O_5$ crystal phase and the $A_1Ti_3B_1O_9$ crystal phase are similar in that the crystal phase is of composite oxide containing the element A (alkali metal), Ti (titanium) and the element B (at least one of Nb and Ta). The composite oxide containing the element A, Ti (titanium) and the element B is called "A-Ti—B—O composite oxide". In the present invention, the A-Ti—B—O composite oxide (where the element A is an alkali metal; the element B is at least one of Nb and Ta; and the contents of the element A, the element B and Ti are not zero) is used as the second crystal phase. It is particularly preferable to use the A-Ti—B—O composite oxide that does not itself exhibit piezoelectric properties but, when coexisting with the first crystal phase, improves in the sinterability and, in addition, insulating properties of the piezoelectric ceramic composition and shows no phase transition point between −50° C. and +150° C.

The lead-free piezoelectric ceramic composition according to one embodiment of the present invention may further contain at least one additive metal element selected from Cu (copper), Ni (nickel), Co (cobalt), Fe (iron), Mn (manganese), Cr (chromium), Zr (zirconium), Ag (silver), Zn (zinc), Sc (scandium) and Bi (bismuth). The lead-free piezoelectric ceramic composition can be provided with good properties (notably, piezoelectric constant $d_{33}$) by the addition of such at least one metal element. The total content of the additive metal element in the composition is preferably 5 mol % or less, more preferably 1 mol % or less. If the total content of the additive metal element exceed 5%, the piezoelectric properties of the composition may be rather deteriorated. In the case of adding two or more kinds of metal elements, the content of each of the additive metal elements in the composition is preferably less than 1 mol %. There is a possibility that the piezoelectric properties of the composition may also be deteriorated if the content of each of the additive metal elements exceeds 1 mol %.

FIG. 1 is a flowchart showing one example of a process for production of a piezoelectric element according to one embodiment of the present invention. In step T110, any required ones of $K_2CO_3$ powder, $Na_2CO_3$ powder, $Li_2CO_3$ powder, $CaCO_3$ powder, $SrCO_3$ powder, $BaCO_3$ powder, $Nb_2O_5$ powder and $Ta_2O_5$ powder are selected as raw materials of the main phase (KNN) and weighed out according to the factors a to e of the compositional formula of the main phase. A slurry is prepared by adding ethanol to these raw material powders and subjecting the powder mixture to wet mixing by a ball mill for preferably 15 hours. In step T120, the slurry is dried to a powder, and then, the resulting mixed powder is formed into a main-phase calcination product by calcination, for example, in the air at 600 to 1000° C. for 1 to 10 hours.

In step T130, any required ones of $K_2CO_3$ powder, $Rb_2CO_3$ powder, $Cs_2CO_3$ powder, $TiO_2$ powder, $Nb_2O_5$ powder, $Ta_2O_5$ powder and the like are selected and weighed out according to the factor x of the compositional formula of the secondary phase. A slurry is prepared by adding ethanol to these raw material powders and subjecting the powder mixture to wet mixing by a ball mill for preferably 15 hours. In step T140, the slurry is dried to a powder, and then, the resulting mixed powder is formed into a secondary-phase calcination product by calcination, for example, in the air at 600 to 1000° C. for 1 to 10 hours.

In step T150, the main-phase calcination product and the secondary-phase calcination product are weighed out, admixed with a dispersant, a binder and ethanol, and then, subjected to milling and mixing by a ball mill, thereby obtaining a slurry. In the case of adding any additive metal, a required one or ones of CuO powder, $Fe_2O_3$ powder, NiO powder, $Ag_2O$ powder, $ZrO_2$ powder, ZnO powder, MgO powder, $Sc_2O_3$ powder, $Bi_2O_3$ powder, $Cr_2O_3$ powder, $MnO_2$ powder, CoO powder and the like are selected, weighed out and added to the slurry. This slurry may be again subjected to calcination, and then, milling and mixing. After that, the slurry is dried, subjected to granulation and molded into a desired shape by, for example, uniaxial press forming at a pressure of 20 MPa. According to one embodiment of the present invention, the piezoelectric ceramic composition is suitably formed into a disk shape or a cylindrical column shape. The resulting molded body is pressed by CIP treatment (cold isostatic press treatment), for example, at a pressure of 150 MPa. In step T160, the CIP-pressed body is baked, for example, in the air at 900 to 1300° C. for 1 to 10 hours. By this, the piezoelectric ceramic body is completed. Alternatively, the baking may be performed in an $O_2$ atmosphere. In step T170, the piezoelectric ceramic body is processed according to the dimension accuracy required of the piezoelectric element. In step T180, electrodes are fixed to the piezoelectric ceramic body. In step T190, the thus-obtained piezoelectric element is subjected to polarization.

Although the additive metal is added in metal oxide form in step T150, the above-mentioned preferable content of the additive metal is by mol % in terms of the metal element. The additive metal may alternatively be added in the form of an oxide containing both the alkaline-earth metal and the additive metal as represented by $CMO_3$ (where the element C is at least one of Ca, Sr and Ba; and the element M is the additive metal), rather than the metal oxide containing only the additive metal as its metal element, to the first crystal phase (main phase) and the second crystal phase (secondary phase) in step T150. In this case, the element C (alkaline-earth metal) contained in the oxide $CMO_3$ as the third component is utilized as the element C of the first crystal phase in the piezoelectric ceramic body after the baking.

The above production process is merely one example. There can be adopted any other various steps and treatment conditions for production of the piezoelectric element. For example, it is feasible to produce the piezoelectric ceramic composition by weighing out raw materials according to the final composition ratio of the piezoelectric ceramic composition, and then, mixing and baking the raw materials, in place of forming the first and second crystal phases separately, mixing the powder of these crystal phases together and baking the mixed powder material as shown in FIG. 1. It is however easier in the production process of FIG. 1 to control the compositions of the first and second crystal phases more strictly and is thus possible to improve the yield of the piezoelectric ceramic composition.

Figure 2:
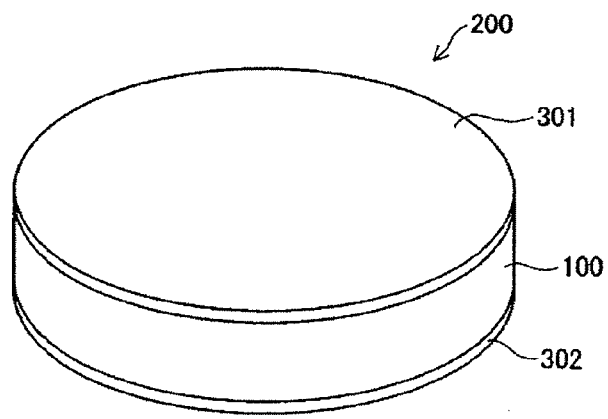
FIG. 2 is a perspective view of a piezoelectric element according to one embodiment of the present invention.

FIG. 2 is a perspective view of a piezoelectric element according to one embodiment of the present invention. This piezoelectric element 200 has a disk-shaped piezoelectric ceramic body 100 and electrodes 301 and 302 fixed to upper and lower surfaces of the piezoelectric ceramic body 100. The piezoelectric element is not limited to this configuration and can be provided in any various other configurations.

Figure 3A:
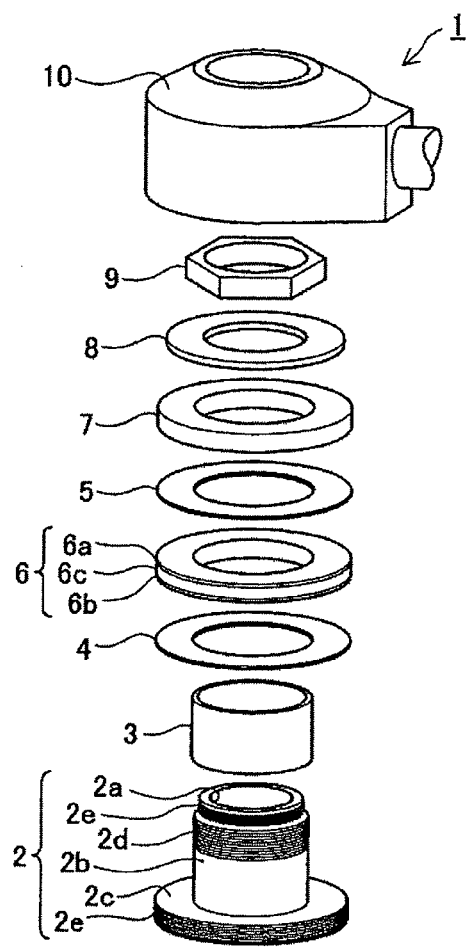
FIG. 3A is a perspective view of a knock sensor according to one embodiment of the present invention.

FIG. 3A is an exploded perspective view of a knock sensor using the piezoelectric ceramic body according to one embodiment of the present invention. This knock sensor 1 is designed as a so-called non-resonant knock sensor and includes a metal shell 2, an insulating sleeve 3, insulating plates 4 and 5, a piezoelectric element 6, a property-adjusting weight 7, a washer 8, a nut 9 and a housing 10. The metal shell 2 has a cylindrical portion 2b formed with a though hole 2a and a doughnut plate-shaped seat portion 2c protruding in a flange-like manner from a lower end of the cylindrical portion 2b. Threads 2d are cut in an upper part of the cylindrical portion 2b; and grooves 2e are formed circumferentially in an upper end of the cylindrical portion 2b and an outer circumferential edge of the seat portion 2c for improvement of the adhesion of the metal shell 2 to the housing 10. These respective portions 2a to 2d of the metal shell 2 can be formed integrally by any appropriate production method (casting, forging, shaving etc.). Further, plating treatment (zinc chromate plating) is applied to a surface of the metal shell 2 for improvement in corrosion resistance.

The insulating sleeve 3 is formed into a thin cylindrical shape and made of an insulating material (such as a plastic material e.g. PET or PBT, a rubber material or the like). Each of the insulating plates 4 and 5 is formed into a thin doughnut plate shape and made of an insulating material (such as a plastic material e.g. PET or PBT, a rubber material or the like). The piezoelectric element 6 serves as a vibration detecting element and includes a two thin electrodes 6a and 6b and a piezoelectric ceramic body 6c laminated between the electrodes 6a and 6b. The piezoelectric element 6 as a whole has a doughnut plate shape.

The property-adjusting weight 7 is formed into a doughnut plate shape and made of a material having a given density (such as a metal material e.g. brass). The insulating sleeve 3 is fitted around the cylindrical portion 2b of the metal shell 2; and the insulating plate 4, the piezoelectric element 6, the insulating plate 5 and the property-adjusting weight 7 are fitted, in this order, on the insulating sleeve 3. Further, the nut 9 is screwed onto the threads 2d of the cylindrical portion 2b of the metal shell 2 via the washer 8. The insulating plate 4, the piezoelectric element 6, the insulating plate 5, the property-adjusting weight 7 and the washer 8 are thus held between an upper surface of the seat portion 2c of the metal shell 2 and the nut 9. The housing 10 is formed by injection molding of an insulating material (such as a plastic material e.g. PA) in such a manner as to cover these structural members 4 to 8, with only a lower surface of the seat portion 2c of the metal shell 2 being exposed from an lower end portion of the housing 10 and only the upper end of the cylindrical portion 2b of the metal shell 2 being exposed from an upper end portion of the housing 10. The piezoelectric element 6 is circumferentially surrounded by the insulating sleeve 3, the insulating plates 4 and the housing 10 and thereby kept insulated from the metal shell 2 and the property-adjusting weight 7. Lead wires (not shown) are connected to the electrodes 6a and 6b of the piezoelectric element 6, respectively, and led out of the housing 10.

The above-structured knock sensor 1 can achieve high knocking detection accuracy and heat resistance by the use of the piezoelectric element 6 that has good piezoelectric properties and shows no abrupt property changes between −50° C. and +150° C.

Figure 3B:
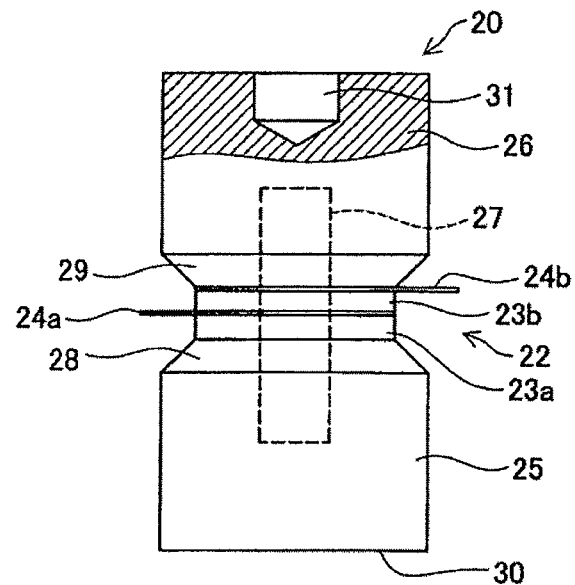
FIG. 3B is a vertical section view of an ultrasonic transducer according to one embodiment of the present invention.

FIG. 3B is a vertical section view of an ultrasonic transducer according to one embodiment of the present invention. This ultrasonic transducer 20 is designed as a Langevin type ultrasonic transducer and includes a piezoelectric element pair 22 and a pair of vertically opposed front plate 25 and backing plate 26 holding therebetween the piezoelectric element pair 22. The piezoelectric element pair 22 has two annular piezoelectric elements 23a and 23b, an electrode plate 24a inserted and laminated between the annular piezoelectric elements 23 and 23b and an electrode plate 24b arranged on an front side of the front annular piezoelectric element 23b. Each of the front plate 25 and the backing plate 26 is formed into a cylindrical columnar metal block using iron or aluminum as a raw material. The piezoelectric element pair 22 is arranged between and fixed to the front plate 25 and the backing plate 26 by a center bolt 27.

The front plate 25 and the backing plate 26 are made larger in diameter than the piezoelectric elements 23a and 23b and have conical end portions 28 and 29 brought into contact with the piezoelectric elements 23a and 23b and formed in such a manner that the diameter of the conical end portions 28 and 29 gradually decreases and becomes substantially equal to the diameter of the piezoelectric elements 23a and 23b. The diameter R2 of the backing plate 26 is substantially equal to the diameter R1 of the front plate 25. An ultrasonic radiation surface 30 is formed on an outer end face of the front plate 25, whereas a blind hole having a diameter R3 is formed axially in the center of an outer end face of the backing plate 26. The entire length of the piezoelectric transducer 20 is substantially equal to three-halves the wavelength of a predetermined resonance frequency.

The above-structured ultrasonic transducer can generate ultrasonic waves with a stable frequency and achieve high heat resistance by the use of the piezoelectric elements 23a and 23b that have good piezoelectric properties and show no abrupt property changes between −50° C. and +150° C.

Figure 3C:
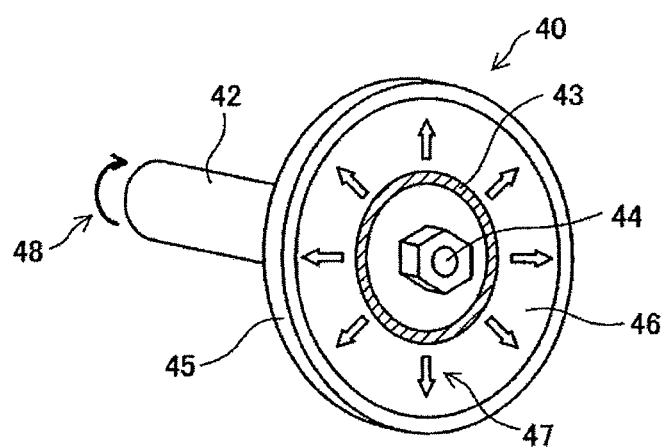
FIG. 3C is a perspective view of a cutting tool according to one embodiment of the present invention.

FIG. 3C is a perspective view of a cutting tool according to one embodiment of the present invention. This cutting tool 40 includes a circular base portion 46 and a grinding portion 45 formed on an outer circumference of the base portion 46. The base portion 46 is fixed at the center thereof to a spindle 42 by a fixing jig 44. Annular piezoelectric elements 43 are embedded in both surfaces of the base portion 46. A vibration direction of the piezoelectric elements 43 is a radial direction 47 from the center toward the outer circumference of the base portion 46. A workpiece is cut by pressing the grinding portion 45, which is formed around the base portion 46, onto the workpiece in the state of rotating the spindle 42 in a rotation direction 48 while vibrating the piezoelectric elements 43.

The above-structured cutting tool can achieve high heat resistance by the use of the piezoelectric elements 43 that have good piezoelectric properties and show no abrupt property changes between −50° C. and +150° C.

The piezoelectric ceramic composition and the piezoelectric element according to the embodiments of the present invention are widely applicable for vibration detection, pressure detection, oscillation, piezoelectric device use etc. Specific examples of the applications of the piezoelectric ceramic composition and the piezoelectric element are various vibration detection sensors (e.g. a knock sensor and a combustion pressure sensor), piezoelectric devices such as transducers, actuators, and filters, high-voltage generation systems, micro power sources, drive systems, position control systems, vibration control systems and fluid ejection systems (e.g. paint ejection and fuel ejection systems). The piezoelectric ceramic composition and the piezoelectric element according to the embodiments of the present invention are particularly suitable for uses where high heat resistance is desired (e.g. a knock sensor and a combustion pressure sensor).

EXAMPLES

FIG. 4 is a diagram showing experimental results on the properties of a plurality of sample compositions including examples of the present invention. The influence of the content of the secondary phase on the properties of the piezoelectric ceramic composition can be evaluated from these experimental results. The influences of the kind of the constituent element B (Nb, Ta) of the secondary phase and the kind of the constituent element C (Ca, Sr, Ba) of the main phase on the properties of the piezoelectric ceramic composition can also be evaluated from these experimental results.

Herein, samples S01 to S04 of FIG. 4 were prepared as comparative examples. Samples S01 and S02 consisted only of the second crystal phase. The preparation process of samples S01 and S02 was as follows. First, $K_2CO_3$ powder, $Nb_2O_5$ powder and $TiO_2$ powder were weighed out in such a manner as to adjust the factor x of the compositional formula of the second crystal phase as shown in FIG. 4. A slurry was prepared by adding ethanol to these powders and subjecting the powder mixture to wet mixing by a ball mill for 15 hours. A calcination product was then formed by drying the slurry and subjecting the resulting mixed powder to calcination in the air at 600 to 1000° C. for 1 to 10 hours. This calcination product was admixed with a dispersant, a binder and ethanol and subjected to milling and mixing by a ball mill, thereby obtaining a slurry. After that, the slurry was dried, subjected to granulation and molded into a disk shape (diameter: 20 mm, thickness: 2 mm) by uniaxial press forming at a pressure of 20 MPa. The resulting molded body was pressed by CIP treatment at a pressure of 150 MPa. The CIP-pressed was then backed in the air at 900 to 1300° C. for 1 to 10 hours.

Samples S03 and S04 consisted only of the first crystal phase. The preparation process of samples S03 and S04 was as follows. First, $K_2CO_3$ powder, $Na_2CO_3$ powder, $Li_2CO_3$ powder and $Nb_2O_5$ powder were weighed out in such a manner as to adjust the factors a, b, c, d and e of the compositional formula of the first crystal phase as shown in FIG. 4. A slurry was prepared by adding ethanol to these powders and subjecting the powder mixture to wet mixing by a ball mill for 15 hours. A calcination product was then formed by drying the slurry and subjecting the resulting mixed powder to calcination in the air at 600 to 1000° C. for 1 to 10 hours. This calcination product was admixed with a dispersant, a binder and ethanol and subjected to milling and mixing by a ball mill, thereby obtaining a slurry. After that, the slurry was dried, subjected to granulation and molded into a disk shape (diameter: 20 mm, thickness: 2 mm) by uniaxial press forming at a pressure of 20 MPa. The resulting molded body was pressed by CIP treatment at a pressure of 150 MPa. The CIP-pressed body was then baked in the air at 900 to 1300° C. for 1 to 10 hours.

On the other hand, samples S05 to S15 were compositions each of which had both the first crystal phase and the second crystal phase. Each of samples S05 to S15 was prepared through steps T110 to T160 of FIG. 1. Herein, the molded body was disk-shaped (diameter: 20 mm, thickness: 2 mm) in step T150.

Samples of the piezoelectric element 200 (see FIG. 2) were produced by processing these samples S01 to S15 through steps T170 to T190 of FIG. 1 and each tested for the electrical properties (relative dielectric constant $\in_{33}^{T}/\in_0$) of the piezoelectric ceramic body 100 and the piezoelectric properties (piezoelectric constant $d_{33}$ and electromechanical coupling factor kr) of the piezoelectric ceramic body 100. The test results are shown in FIG. 4.

Both of samples S01 and S02 consisted only of the second crystal phase and thus did not show piezoelectric properties. There was no difference in relative dielectric constant $\in_{33}^{T}/\in_0$ between samples S01 and S02 even though the factor x of the compositional formula of the second crystal phase in sample S01 was different from that in sample S02. It is thus assumed that, when the piezoelectric ceramic composition has both the first and second crystal phases, the factor x of the compositional formula of the second crystal phase would have a small influence on the electrical and piezoelectric properties of the piezoelectric ceramic composition. In this sense, the factor x can take any arbitrary value that forms the stable, uniform second crystal phase.

Both of samples S03 and S04 consisted only of the first crystal phase and showed piezoelectric properties. These samples S03 and S04 were similar in that no element C (Ca, Sr, Ba) was contained, but were different in that Li was not contained in sample S03 but was contained in sample S04. The element D of the first crystal phase was Nb (niobium). There was not a large difference in electrical properties (relative dielectric constant $\in_{33}^{T}/\in_0$) and piezoelectric properties (piezoelectric constant $d_{33}$ and electromechanical coupling factor kr) between samples S03 and S04. However, piezoelectric constant $d_{33}$ of sample S04 containing Li was slightly higher than that of sample S03 not containing Li. In view of this point, it is preferable that the first crystal phase contains Li even in the case where the piezoelectric ceramic composition has both the first and second crystal phases.

In sample S05, 5 mol % of the second crystal phase was added to the first crystal phase. The element C (Ca, Sr, Ba) was not contained in the first crystal phase. The factor x of the compositional formula of the second crystal phase was zero. Namely, sample S05 corresponded to the combination of samples S01 and S04. As compared to the properties of sample S04 consisting only of the first crystal phase, sample S05 had a much higher relative dielectric constant $\in_{33}^{T}/\in_0$ and piezoelectric constant $d_{33}$ and showed favorable properties as the piezoelectric ceramic composition. Further, sample S05 was superior in that the electromechanical coupling factor kr of sample S05 was higher than that of sample 04.

In samples S06 to S12, the content of the secondary phase was varied from 3 mol % to 20 mol %. In each sample, the composition of the first crystal phase was $(K_{0.421}Na_{0.518}Li_{0.022}Ca_{0.039})_{1.07}Nb_{3.06}$; and the composition of the second crystal phase was $K_{0.85}Ti_{0.85}B_{1.15}O_5$. Samples S06 to S12 were favorable in that the relative dielectric constant $\in_{33}^{T}/\in_0$ of the samples S06 to S12 was sufficiently higher than that of comparative example sample S04. The content of the secondary phase is thus preferably in the range of 3 to 10 mol %, more preferably 3 to 6 mol %, in terms of the relative dielectric constant.

Samples S06 to S11 were also favorable in that the piezoelectric constant $d_{33}$ of samples S06 to S11 was sufficiently higher than that of comparative example sample S04. However, sample S12 in which the content of the secondary phase was 20 mol % was unfavorable as the piezoelectric constant $d_{33}$ of sample S12 was lower than that of comparative example sample S04.

Figure 5:
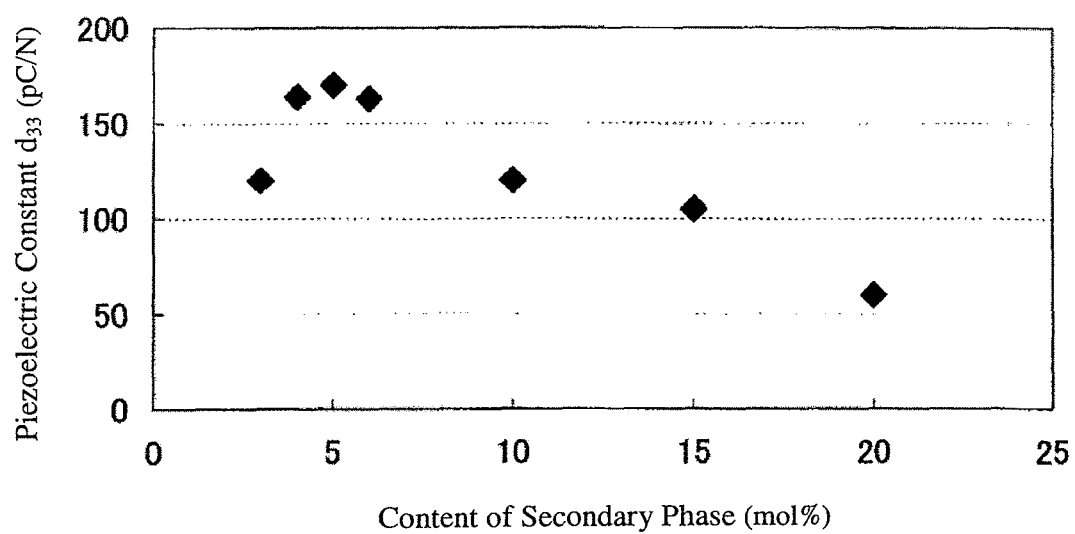
FIG. 5 is a graph showing experimental results about the influence of the content of the secondary phase on the piezoelectric constant of the piezoelectric ceramic composition.

FIG. 5 is a graph showing variations of the piezoelectric constant $d_{33}$ of samples S06 to S12. In FIG. 5, the horizontal axis indicates the content of the secondary phase; and the vertical axis indicates the piezoelectric constant $d_{33}$. As is seen from this graph, the content of the secondary phase is preferably in the range of 3 to 15 mol %, more preferably 3 to 10 mol %, most preferably 4 to 6 mol %, in terms of the piezoelectric constant $d_{33}$.

Furthermore, samples S06 to S11 were favorable in that the electromechanical coupling factor kr of samples S06 to S11 was equivalent to or higher than that of comparative example sample S04 (see FIG. 4). However, sample S12 in which the content amount of the secondary phase was 20 mol % was unfavorable as the electromechanical coupling factor kr of sample S12 was considerably lower than that of comparative example sample S04. The content of the secondary phase is thus preferably in the range of 3 to 10 mol %, more preferably 4 to 6 mol %, in terms of the electromechanical coupling factor.

Samples S05 and S08 were similar in that the content of the secondary phase was 5 mol %. However, these samples S05 and S08 were largely different in that: the element C (Ca, Sr, Ba) was not contained at all in the first crystal phase of sample S05; whereas Ca was contained as the element C in the first crystal phase of sample S08. Although the factor x of the compositional formula of the second crystal phase of sample S05 was different from that of sample S08, it is assumed that the influence of such a difference in the factor x on the properties of the piezoelectric ceramic composition would be relatively small as considered above by comparison of samples S01 and S02. Upon comparison of samples S05 and S08, sample S08 in which Ca was contained in the first crystal phase had a higher relative dielectric constant $\in_{33}^{T}/\in_0$, piezoelectric constant $d_{33}$ and electromechanical coupling factor kr than those of sample S05. It is thus preferable to contain Ca as the element C in the first crystal phase. The same effects can be expected when the other alkaline-earth metal (Sr, Ba) is contained as the element C.

It is herein noted that what is important among the three properties: relative dielectric constant $\in_{33}^{T}/\in_0$, piezoelectric constant $d_{33}$ and electromechanical coupling factor kr changes depending on the use of the piezoelectric ceramic composition. For example, the composition having a high relative dielectric constant $\in_{33}^{T}/\in_0$ is suitable for use in a condenser. The composition having a high piezoelectric constant $d_{33}$ is suitable for use in an actuator and a sensor. The composition having a high electromechanical coupling factor kr is suitable for use in an piezoelectric transducer and an actuator. The composition can be determined according to the properties required of the use of the composition.

Samples S13 and S14 of FIG. 4 were prepared to mainly examine the influence of the element B (Nb, Ta) of the second crystal phase. There was not a large difference in relative dielectric constant $\in_{33}^{T}/\in_0$, piezoelectric constant $d_{33}$ and electromechanical coupling factor kr between samples S13 and S14. It is thus understood that either of Nb and Ta is preferred as the element B.

Sample S14 was similar in composition to sample S08. More specifically, the compositions of Samples S08 and S14 were substantially the same as each other, except for the content of Ca as the element C of the first crystal phase and resultantly the contents of K and Na. Upon comparison of the properties of these samples, sample S14 in which the Ca content was higher was favorable in terms of the relative dielectric constant $\in_{33}^{T}/\in_0$; whereas sample S08 in which the Ca content was lower was favorable in terms of the piezoelectric constant $d_{33}$ and electromechanical coupling factor kr.

Sample S15 was similar in composition to sample S08, except that Ca and Sr were contained in equal proportions (equal atomic %) as the element C of the first crystal phase, and had a slightly lower relative dielectric constant $\epsilon_{33}^T/\epsilon_0$, piezoelectric constant $d_{33}$ and electromechanical coupling factor kr than those of the sample S08. However, the relative dielectric constant $\epsilon_{33}^T/\epsilon_0$ and piezoelectric constant $d_{33}$ of sample S15 was sufficiently higher than those of comparative example sample S04. The favorable composition can be thus obtained when either of the alkaline-earth metals Ca and Sr is used as the element C of the first crystal phase. It is expected that the composition can attain analogous properties even by the use of Ba in place of Ca and Sr (or in combination of Ca and Sr). However, the composition can be provided with good properties at low cost by the use of Ca as the element C.

FIG. 6 is a diagram showing evaluation test results about the occurrence or non-occurrence of a Curie point and a room-temperature phase transition in the same samples S01 to S15 as those of FIG. 4. The Curie point of samples S05 to S15 was in a range of 300 to 350° C. In general, it suffices that the piezoelectric ceramic composition has a Curie point of 300° C. or higher. Thus, sample S05 to S15 had a sufficiently high Curie point. As the Curie point depends on the properties of the first crystal phase, it is assumed that the Curie point would not change so largely even when the composition or content of the secondary phase varies slightly. Incidentally, samples S05 to S12 and S14 to S15 in each of which Nb was used as the element B of the second crystal phase had a higher Curie temperature than that of the sample S14 in which Ta was used as the element B of the second crystal phase. Thus, Ta is more preferred than Ba as the element B of the second crystal phase in terms of the Curie temperature.

For evaluation of the occurrence or non-occurrence of the room-temperature phase transition, the relative dielectric constant was measured by gradually changing the ambient temperature in a range of −50° C. to +150° C. In general, when the piezoelectric ceramic composition has a phase transition point in a certain temperature range, the relative dielectric constant $\epsilon_{33}^T/\epsilon_0$ of the piezoelectric ceramic composition sharply changes to show a clear peak in response to temperature changes in the certain temperature range. By contrast, when the phase transition point of the piezoelectric ceramic composition is not in a certain temperature range, the relative dielectric constant $\epsilon_{33}^T/\epsilon_0$ of the piezoelectric ceramic composition does not show a clear peak and changes gently in the certain temperature range. It was thus judged whether a phase transition point was observed clearly or not, by monitoring changes of the relative dielectric constant $\epsilon_{33}^T/\epsilon_0$ of the piezoelectric ceramic composition while gradually changing the temperature from −50° C. to +150° C., to thereby determine the occurrence or non-occurrence of the room-temperature phase transition. Herein, the term "room-temperature" refers to a wider range of temperature than the ordinary room temperature (25° C.).

The room-temperature phase transition was observed in both of comparative example samples S03 and S04; whereas the room-temperature phase transition was not observed in any of samples S05 to S15. The occurrence of a room-temperature phase transition is unfavorable as the electrical and piezoelectric properties of the piezoelectric ceramic composition change largely before and after the phase transition. Samples S05 to S15, each of which had both the first and second crystal phases, were thus more favorable than comparative example samples S03 and S04 in view of the fact that the room-temperature phase transition did not occur in any of samples S05 to S15.

FIG. 7 is a diagram showing experimental results about the influence of the factor e of the compositional formula of the main phase on the properties of the piezoelectric ceramic composition. In the top section of FIG. 7, the properties of the comparative example sample S04 are indicated. Among the factors a to f of the compositional formula of the first crystal phase, the factors a to d were the same but the factor e (the number of alkali elements at the A site) was different in samples S21 to S27. Further, Ca (calcium) was contained as the alkaline-earth metal (the element C of the compositional formula) in the first crystal phase. The content of the secondary phase was 5 mol % in each of samples S21 to S27. The factor x of the compositional formula of the second crystal phase was zero in sample S21 and 0.15 in samples S22 to S27. The influence of the factor x on the properties of the piezoelectric ceramic composition is however small as mentioned above. Herein, sample S25 was the same as sample S14 of FIG. 4.

Samples S21 to S27 were favorable in that the relative dielectric constant $\epsilon_{33}^T/\epsilon_0$ of samples S21 to S27 were sufficiently higher than that of comparative example sample S04. The factor e of the compositional formula of the first crystal phase is thus preferably in the range of 0.97 to 1.1, more preferably 1.0 to 1.1, in terms of the relative dielectric constant $\epsilon_{33}^T/\epsilon_0$. Samples S21 and S25 were also favorable in that the piezoelectric constant $d_{33}$ of samples S21 and S25 were higher than that of comparative example sample S04. On the other hand, samples S26 and S27 in which the factor e was larger than 1.08 were unfavorable as the piezoelectric constant $d_{33}$ of samples S26 and S27 was lower than that of comparative example sample S04.

Figure 8:
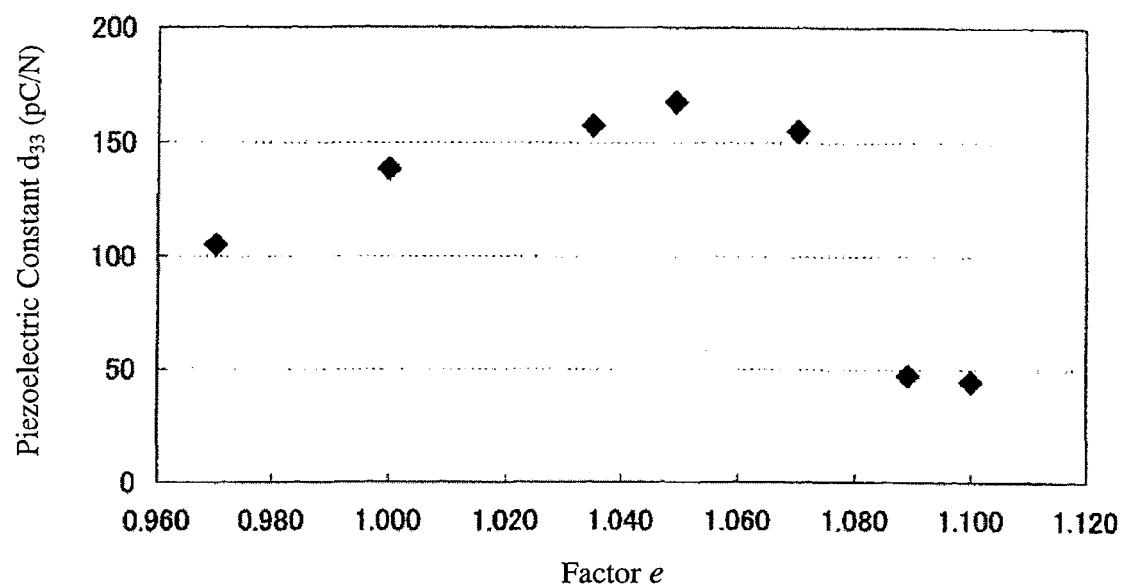
FIG. 8 is a graph showing experimental results about the influence of the factor e of the compositional formula of the main phase on the properties of the piezoelectric ceramic composition.

FIG. 8 is a graph showing the piezoelectric constant $d_{33}$ of samples S21 to S27. In FIG. 8, the horizontal axis indicates the factor e of the compositional formula of the first crystal phase. The factor e designates the ratio between the sum of the number of atoms of alkali metal element (K+Na+Li) and the number of atoms of alkaline-earth metal (the element C) and the number of atoms of Nb (niobium). As is seen from this graph, the factor e of the compositional formula of the first crystal phase is preferably in the range of 0.97 to 1.08, more preferably 1.00 to 1.07, in terms of the piezoelectric constant.

In FIG. 7, samples S26 and S27 were unfavorable as the electromechanical coupling factor kr of samples S26 and S27 were lower than that of comparative example sample S04. In terms of the electromechanical coupling factor, the factor e of the compositional formula of the first crystal phase is also preferably in the range of 0.97 to 1.08, more preferably 1.00 to 1.07.

FIG. 9 is a diagram showing experimental results about the influence of the additive metal on the properties of the piezoelectric ceramic composition. In the top section of FIG. 9, the properties of comparative example sample S04 are indicated. Herein, sample S31 was a comparative example consisting only of the first crystal phase and containing 1 mol % of Cu as the additive metal. This sample S31 had a lower relative dielectric constant $\epsilon_{33}^T/\epsilon_0$ than that of comparative example sample S04 but a higher electromechanical coupling factor kr than that of comparative example sample S04.

On the other hand, samples S32 to S43 were compositions each containing 5 mol % of the second crystal phase. Among the factors a to f of the compositional formula of the first crystal phase, the factors a and b were slightly different from sample to sample; and the other factors c to f were substantially uniform. Herein, sample S32 was the same as sample S08 of FIG. 4 and did not contain any additive metal.

As is seen from the results of samples S33 to S43, the piezoelectric ceramic composition can be provided with sufficiently good properties by the addition of at least one metal element selected from Cu (copper), Ni (nickel), Co (cobalt), Fe (iron), Mn (manganese), Zr (zirconium), Ag (silver), Zn (zinc), Sc (scandium) and Bi (bismuth) as the additive metal. It is expected that, even by the addition of Cr (chromium), the piezoelectric ceramic composition can be provided with the same properties as those by the addition of Mn (manganese). As is seen from the comparison of three samples S32 to S34, the content of each additive metal element is preferably less than 1 mol %. Further, the total content of the additive metal is preferably 5 mol % or less. When the content of the additive metal exceeds this limit value, the relative dielectric constant $\in_{33}^{T}/\in_0$ and piezoelectric constant $d_{33}$ of the composition may be rather deteriorated.

FIG. 10 is a diagram showing experimental results about the influence of the presence or absence of the secondary phase on the insulating properties of the piezoelectric ceramic composition. In this diagram, measured values of the applicable voltage of samples S03, S04 and S08 of FIG. 4 and sample S35 of FIG. 9 are indicated. The term "applicable voltage" refers to a maximum applicable voltage of each of the samples of the piezoelectric element 200 at which there occurs no breakage such as crack in the piezoelectric ceramic body 100. The measurements of FIG. 10 were conducted to examine the occurrence of any breakage such as crack in the piezoelectric ceramic body 100 by the application of a given voltage for 30 minutes in an environment of 80° C. The applicable voltage is considered as a measure of the insulating properties of the piezoelectric ceramic composition.

The applicable voltage of each of samples S03 and S04 containing no secondary phase was 3 kV/mm; whereas the applicable voltage of samples S08 and S05 containing 5 mol % of the secondary phase was 7 kV/mm and 9 kV/mm, respectively. It is understood from these experimental results that the insulating properties of the piezoelectric ceramic composition can also be improved by the coexistence of the structurally stable secondary phase (second crystal phase) with the first crystal phase.

FIG. 11 is a diagram showing analysis results on the second crystal phase of the piezoelectric ceramic composition. In FIG. 11, first four samples S06, S08, S10 and S12 were the same piezoelectric ceramic compositions as those indicated by the respective sample numbers in FIG. 4; and other five samples S33, S35, S36, S40 and S42 were the same piezoelectric ceramic compositions as those indicated by the respective sample numbers in FIG. 9. The secondary phase (NTK phase) of these nine samples was analyzed by XRD analysis (X-ray diffraction) and TEM-EDS analysis (energy-dispersive x-ray analysis using a transmission electron microscope). Although the composition of the secondary phase can be generally confirmed by X-ray diffraction, it is feasible to confirm the composition of the secondary phase by TEM-EDS technique or the like in the case where the content of the secondary phase added or generated is low.

The analysis results are indicated in two right columns of FIG. 11. In these columns, the term "1115" refers to a "1115 phase ($KTiNbO_5$ phase)"; and the term "1319" refers to a "1319 phase ($KTi_3NbO_9$ phase)". As is seen from the analysis results, either or both of the 1115 phase and the 1319 are formed as the secondary phase of the piezoelectric ceramic composition. In particular, the 1319 phase is often formed as the secondary phase with the addition of the additive metal.

The above-explained samples of FIGS. 3 to 9, including nine samples of FIG. 11, were each produced by using the secondary-phase material formed of 1115 phase in the production process. Namely, each of these samples was produced by, in FIG. 1, forming the secondary-phase material of 1115 phase in steps T130 and T140, mixing the secondary-phase material with the main-phase material in step T150 and baking the resulting mixed material in step T160. It is assumed that, in the secondary phases of the some respective sample of FIG. 11, the 1319 phase was converted from the 1115 phase during the baking of step T160. As explained above in FIGS. 4 and 9, the samples of FIG. 11 combined good electrical properties (relative dielectric constant $\in_{33}^{T}/\in_0$) with good piezoelectric properties (piezoelectric constant $d_{33}$ and electromechanical coupling factor kr). The piezoelectric ceramic composition can be thus provided with good properties even when the secondary phase is either of 1115 phase and 1319 phase after the baking.

FIG. 12 is a diagram showing analysis results on samples of the piezoelectric ceramic composition produced by mixing the secondary-phase material formed of 1319 phase with the main-phase material. The content of the secondary phase was 3 mol % in sample S51 and 5 mol % in other samples S52 to S57. Further, no additive metal was added in samples S51 and S52. Each of these samples was produced by, in FIG. 1, forming the second-phase material of 1319 phase in steps T130 and T140, mixing the secondary-phase material with the main-phase material in step T150 and baking the resulting mixed material in step T160. As seen from the analysis results of samples S51 to S57, the secondary phase was 1319 phase in each sample. Further, samples S51 to S57 combined good electrical properties (relative dielectric constant $\in_{33}^{T}/\in_0$) with good piezoelectric properties (piezoelectric constant $d_{33}$ and electromechanical coupling factor kr) (not shown in the diagram) as in the case of samples S35 and S36 of FIG. 11.

FIG. 13 is a diagram showing experimental results, on different samples S61 to S81 from samples S32 to S43 of FIG. 9, about the influence of the additive metal on the properties of the piezoelectric ceramic composition. In the top section of FIG. 13, the properties of the comparative example samples S04 and S31 are indicated. Each of these samples were produced by preparing and using the 1115 phase as the second crystal phase. In samples S61 to S80, 5 mol % of the second crystal phase was contained. The second crystal phase was not contained in sample S81. Further, two of Ca, Sr and B were contained as the element C of the first crystal phase in any of samples S61 to S81, other than samples S69, S72 and S76. These two elements are indicated in the column of "element C1, C2" of the section of "first crystal phase"; and the factors for these two elements are indicated in the column of "factor d1, d2".

Among samples S61 to S81, last two samples S80 and S81 were each a defective piece as the composition was not sufficiently closely packed during the baking of step T160 of FIG. 1. The reason for this is assumed that: the factor e for the entire A site was 1.12 and was too large in sample S80. However, both of sample S79 in which the factor e was 1.09 and sample S78 in which the factor e was 0.98 combined good electrical properties (relative dielectric constant $\in_{33}^{T}/\in_0$) with good piezoelectric properties (piezoelectric constant $d_{33}$ and electromechanical coupling factor kr). In comprehensive consideration of the results of FIG. 13, the factor e of the compositional formula of the first crystal phase is preferably in the range of 0.97 to 1.10, more preferably 1.00 to 1.09, when the additive metal is added in the composition.

As is seen from FIG. 11 and FIG. 9, the piezoelectric ceramic composition can be provided with sufficiently good properties by the addition of at least one metal element selected from Cu (copper), Ni (nickel), Co (cobalt), Fe (iron), Mn (manganese), Zr (zirconium), Ag (silver), Zn (zinc), Sc (scandium) and Bi (bismuth) as the additive metal as compared to the properties of comparative example samples S04 and S31. It is expected that, even by the addition of Cr (chromium), the piezoelectric ceramic composition can be provided with the same properties as those by the addition of Mn (manganese).

FIG. 14 is a diagram showing results of thermal cycle test on samples of the piezoelectric ceramic composition. Herein, three samples S04, S31 and S32 of FIG. 9 and eight samples S61 to S65 and S67 to S69 of FIG. 13 were tested. The thermal cycle test was conducted on each sample as follows. In a state that the sample was placed in a thermostat, the piezoelectric properties of the sample were evaluated (see the column of "initial value" of the section of "electromechanical coupling factor kr" in FIG. 14). The sample was then subjected to repeated thermal cycle of −50° C., 150° C., 20° C., 150° C. and 20° C. at a temperature increase/decrease rate of 2° C./min. The holding time of the sample at each temperature was 1 hour. After that, the piezoelectric properties of the sample were evaluated again (see the column of "after thermal cycle").

As seen from the results of FIG. 14, the electromechanical coupling factor kr after the thermal cycle showed a large decrease rate of about 70% in samples S04 and S31 containing no second crystal phase. On the other hand, the electromechanical coupling factor kr after the thermal cycle showed a sufficiently small, favorable decrease rate of about 10% to about 26%. Thus, the piezoelectric ceramic composition containing the second crystal phase does not show excessive property deterioration even when subjected to thermal cycle and can be suitably applicable for uses where high heat resistance is desired (such as a knock sensor and a combustion pressure sensor).

DESCRIPTION OF REFERENCE NUMERALS

1: Knock sensor
2: Metal shell
2a: Through hole
2b: Cylindrical portion
2c: Seat portion
2d: Threads
2e: Grooves
3: Insulating sleeve
4: Insulating plate
5: Insulating plate
6: Piezoelectric element
6a: Electrode
6b: Electrode
6c: Piezoelectric ceramic body
7: Property-adjusting weight
8: Washer
9: Nut
10: Housing
20: Langevin type ultrasonic transducer
22: Piezoelectric element pair
23a, 23b: Piezoelectric element
24a, 24b: Electrode plate
25: Front plate
26: Backing plate
27: Center bolt
28, 29: Conical portion
30: Ultrasonic radiation surface
31: Blind hole
40: Ultrasonic cutting tool
42: Spindle
43: Piezoelectric element
44: Fixing jig
45: Grinding portion
46: Base portion
47: Arrow indicating vibration direction
48: Arrow indicating spindle rotation direction
100: Piezoelectric ceramic body
200: Piezoelectric element
301, 302: Electrode

The invention claimed is:

1. A lead-free piezoelectric ceramic composition, comprising:
a first crystal phase of alkali niobate/tantalate type perovskite oxide having piezoelectric properties; and
a second crystal phase of A-Ti—B—O composite oxide having no piezoelectric properties (where the element A is an alkali metal; the element B is at least one of Nb and Ta; and the contents of the element A, the element B and Ti are not zero),
wherein the alkali niobate/tantalate type perovskite oxide of the first crystal phase is represented by $(K_a Na_b Li_c C_d)_e DO_f$ (wherein the element C is at least one alkaline-earth metal selected from Ca, Sr and Ba; the element D is at least one of Nb and Ta; a, b, c and d satisfy the conditions of $0<a\leq0.6$, $0<b\leq0.6$, $0<c\leq0.2$, $0<d\leq0.1$, $0.97\leq e\leq1.08$ and $a+b+c+d=1$; and f is an arbitrary value that satisfies the condition of $(a+b+c+2\cdot d)\cdot e+5\approx 2\cdot f$ such that the perovskite oxide can be constituted by the first crystal phase), and
wherein the A-Ti—B—O composite oxide of the second crystal phase is represented by $A_{1-x}Ti_{1-x}B_{1+x}O_5$ (where x satisfies the condition of $0\leq x\leq 0.15$).

2. The lead-free piezoelectric ceramic composition according to claim 1, wherein the element B is Nb.

3. The lead-free piezoelectric ceramic composition according to claim 1, further comprising at least one metal element selected from Cu, Ni, Co, Fe, Mn, Cr, Zr, Ag, Zn, Sc and Bi.

4. A piezoelectric element, comprising:
a piezoelectric ceramic body formed of the lead-free piezoelectric ceramic composition according to claim 1; and
electrodes fixed to the piezoelectric ceramic body.

5. A knock sensor comprising the piezoelectric element according to claim 4.

6. An ultrasonic transducer comprising the piezoelectric element according to claim 4.

7. A cutting tool comprising the piezoelectric element according to claim 4.

8. A process for production of the lead-free piezoelectric ceramic composition according to claim 1, comprising:
preparing a first powder by mixing and calcinating raw materials of the first crystal phase;
preparing a second powder by mixing and calcinating raw materials of the second crystal phase; and
forming the lead-free piezoelectric ceramic composition by mixing the first and second powders into a mixed power material, and then, molding and baking the mixed powder material.

9. The lead-free piezoelectric ceramic composition according to claim 1,
wherein the content of the second crystal phase in the lead-free piezoelectric ceramic composition is more than 0 mol % and less than or equal to 15 mol %.

10. A lead-free piezoelectric ceramic composition, comprising:
a first crystal phase of alkali niobate/tantalate type perovskite oxide having piezoelectric properties; and
a second crystal phase of A-Ti—B—O composite oxide (where the element A is an alkali metal; the element B is at least one of Nb and Ta; and the contents of the element A, the element B and Ti are not zero), wherein the second crystal phase contains at least one of a crystal phase represented by $A_{1-x}Ti_{1-x}B_{1+x}O_5$ (where x satisfies the condition of $0 \leq x \leq 0.15$) and a crystal phase represented by $A_1Ti_3B_1O_9$.

11. The lead-free piezoelectric ceramic composition according to claim 10, wherein the second crystal phase is a crystal phase represented by $A_{1-x}Ti_{1-x}B_{1+x}O_5$ (where x satisfies the condition of $0 \leq x \leq 0.15$).

12. The lead-free piezoelectric ceramic composition according to claim 10, wherein the element A is K.

13. The lead-free piezoelectric ceramic composition according to claim 10, wherein the element A is Cs; and wherein x satisfies $0 \leq x \leq 0.1$.

14. A piezoelectric element, comprising:
a piezoelectric ceramic body formed of the lead-free piezoelectric ceramic composition according to claim 10; and
electrodes fixed to the piezoelectric ceramic body.

15. A process for production of the lead-free piezoelectric ceramic composition according to claim 10, comprising:

preparing a first powder by mixing and calcinating raw materials of the first crystal phase;
preparing a second powder by mixing and calcinating raw materials of the second crystal phase; and
forming the lead-free piezoelectric ceramic composition by mixing the first and second powders into a mixed power material, and then, molding and baking the mixed powder material.

16. A lead-free piezoelectric ceramic composition, comprising:
a first crystal phase of alkali niobate/tantalate type perovskite oxide having piezoelectric properties; and
a second crystal phase of A-Ti—B—O composite oxide having no piezoelectric properties (where the element A is an alkali metal; the element B is at least one of Nb and Ta; and the contents of the element A, the element B and Ti are not zero),
wherein the A-Ti—B—O composite oxide of the second crystal phase is represented by $A_1Ti_3B_1O_9$.

* * * * *